United States Patent
Tajima et al.

(10) Patent No.: US 9,105,445 B2
(45) Date of Patent: Aug. 11, 2015

(54) INSPECTION SYSTEM, INSPECTION IMAGE DATA GENERATION METHOD, INSPECTION DISPLAY UNIT, DEFECT DETERMINATION METHOD, AND STORAGE MEDIUM ON WHICH INSPECTION DISPLAY PROGRAM IS RECORDED

(71) Applicant: EBARA CORPORATION, Tokyo (JP)

(72) Inventors: Ryo Tajima, Tokyo (JP); Kenichi Suematsu, Tokyo (JP); Shoji Yoshikawa, Tokyo (JP)

(73) Assignee: EBARA CORPORATION, Tokyo (JP)

(*) Notice: Subject to any disclaimer, the term of this patent is extended or adjusted under 35 U.S.C. 154(b) by 0 days.

(21) Appl. No.: 14/220,719

(22) Filed: Mar. 20, 2014

(65) Prior Publication Data

US 2014/0291515 A1 Oct. 2, 2014

(30) Foreign Application Priority Data

Mar. 21, 2013 (JP) .................................. 2013-057863
Apr. 1, 2013 (JP) .................................. 2013-075911
Apr. 17, 2013 (JP) .................................. 2013-086227

(51) Int. Cl.
| | |
|---|---|
| *H01J 37/26* | (2006.01) |
| *H01J 37/22* | (2006.01) |
| *H01J 37/244* | (2006.01) |
| *H01J 37/285* | (2006.01) |

(52) U.S. Cl.
CPC ............. *H01J 37/222* (2013.01); *H01J 37/244* (2013.01); *H01J 37/265* (2013.01); *H01J 37/285* (2013.01)

(58) Field of Classification Search
USPC .................. 250/305, 306, 307, 309, 310, 311
See application file for complete search history.

(56) References Cited

U.S. PATENT DOCUMENTS

| 8,294,073 B1 * | 10/2012 | Vance et al. ............... 250/203.1 |
| 2013/0270444 A1 * | 10/2013 | Subrahmanyan et al. .... 250/372 |
| 2014/0184847 A1 * | 7/2014 | Fujita et al. ................ 348/222.1 |

FOREIGN PATENT DOCUMENTS

| JP | H10-253332 A | 9/1998 |
| JP | H11-132975 A | 5/1999 |
| JP | 2007-048686 A | 2/2007 |
| WO | 02/01596 A1 | 1/2002 |

\* cited by examiner

*Primary Examiner* — Nicole Ippolito
(74) *Attorney, Agent, or Firm* — Pearne & Gordon LLP

(57) ABSTRACT

An inspection system includes a primary optical system configured to irradiate a charged particle or an electromagnetic wave as a beam, a movable unit configured to hold an inspection target and move the target through a position where the beam is irradiated, and a TDI sensor configured to integrate an amount of secondary charged particles in a predetermined direction to sequentially transfer the integrated amount. The secondary charged particles are obtained by irradiating the beam onto the target while moving the movable unit in the predetermined direction. The inspection system further includes a prevention module configured to prevent an arrival of the beam at the target side or an arrival of the secondary charged particles at the TDI sensor during a time period from one transfer to the following transfer after the elapse of a predetermined length of time from the one transfer and until the following transfer.

19 Claims, 15 Drawing Sheets

EMBODIMENT

COMPARISON EXAMPLE

INSPECTION IMAGE (DEFECT IMAGE)

REFERENCE IMAGE

DIFFERENTIAL IMAGE
(EMBODIMENT)

DIFFERENTIAL IMAGE
(COMPARISON EXAMPLE)

INSPECTION SYSTEM, INSPECTION IMAGE DATA GENERATION METHOD, INSPECTION DISPLAY UNIT, DEFECT DETERMINATION METHOD, AND STORAGE MEDIUM ON WHICH INSPECTION DISPLAY PROGRAM IS RECORDED

CROSS-REFERENCE TO RELATED APPLICATIONS

This application claims priority under 35 U.S.C. 119 on Patent Application No. 2013-057863 filed in Japan on Mar. 21, 2013, Patent Application No. 2013-075911 filed in Japan on Apr. 1, 2013, and Patent Application No. 2013-086227 filed in Japan on Apr. 17, 2013, the disclosures of which are hereby incorporated by reference herein in its entireties.

TECHNICAL FIELD

The present invention relates to a technology for generating inspection image data for inspecting a defect or the like in a pattern formed on a surface of an inspection target by irradiating the inspection target with charged particles or electromagnetic waves.

Further, the present invention relates to a technology for generating inspection image data for inspecting a defect or the like in a pattern formed on a surface of an inspection target by irradiating the inspection target with charged particles or electromagnetic waves.

Furthermore, the invention relates to a display technology for determining a type of defect possessed by an inspection target.

BACKGROUND ART

Inspection systems are widely known in which charged particles or electromagnetic waves are irradiated onto the inspection target, a secondary charged particle which is obtained according to the properties of a surface of an inspection target such as a semiconductor wafer or the like is detected by an imaging device by, whereby a pattern or the like which is formed on the surface of the inspection target is inspected by using image data generated based on the results of the detection (for example, Patent Literatures 1 to 3 below). As these inspection systems, in many cases, a system is adopted in which image data is generated by irradiating charged particles or electromagnetic waves onto an inspection target which is held on a movable stage while moving the movable stage and capturing a certain amount of light from the imaging device every time the movable stage moves a distance equal to one pixel of a imaging element. In this system, a TDI (Time Delay Integration) sensor is used as the imaging device. The TDI sensor has a plurality of imaging elements which are arranged in a predetermined number of stages in a vertical stage direction (which coincides with the moving direction of the movable stage). Amounts of secondary charged particles are integrated in the vertical stage direction in synchronism with the movement of the movable state (the inspection target) through the time delay integration, and an integrated detection amount of secondary charged particles is transferred every time the movable stage moves the distance equal to one pixel. According to the system, the amount of secondary charged particles is integrated by the predetermined number of stages, and therefore, when the inspection target is moved even in a high speed, it is possible for the system to have a high sensitivity for imaging. The TDI sensor is based on the premise that the movement of the movable stage and the transfer of secondary charged particles in the vertical stage direction are in synchronism with each other.

In the inspection process, it is desired that a defect is detected based on the generated image data, a type of the detected defect is determined, the defect whose type is determined is analyzed using an SEM (Scanning Electron Microscope) or the like, and the results of the analysis is fed back to the production process quickly. The defect's type determination step is a very important step since the subsequent analysis and feedback are dependent upon the results of the determination.

A luminance or shape which is specific to the type of a defect appears in an inspection image formed by the generated image data. Because of this, it is possible to determine a type of the defect based on the inspection image. For example, when a particle exists on an inspection target, an amount of secondary charged particles obtained from an area where the particle exists becomes larger than those obtained from other areas. Because of this, in the inspection image, a gradation value (a luminance value) of the particle existing area becomes higher than those of the peripheral areas and hence looks brighter. Due to this, the defect attributed to the particle is determined as a "white defect." On the other hand, when a depression exists on the inspection target, an amount of secondary charged particles obtained from an area where the depression exists becomes smaller than those of other areas. Because of this, in the inspection image, a gradation value of the depression existing area becomes lower than those of the peripheral areas and hence looks darker. Due to this, the defect attributed to the depression is determined as a "black defect."

Although the defect's type determination step can be executed by using software without involving manual work, there still exists room for improvement in accuracy. Because of this, normally, the defect's type determination is manually executed in many cases. In the manual defect's type determination step, normally, the operator determines on a type of a defect while looking at an inspection image, a reference image, a differential image and the like which are displayed on a review screen of an inspection system and inputs a classification code which corresponds to the results of the determination into a computer or the like. The reference image is an image that is supposed to be obtained when there is caused no defect in an inspection target. The differential image is an image that has, as gradation values, differences between gradation values of individual pixels of an inspection image and gradation values of corresponding individual pixels of a reference image.

SUMMARY

According to one embodiment of the invention, there is provided an inspection system. The inspection system includes a primary optical system configured to irradiate either of a charged particle and an electromagnetic wave as a beam, a movable unit configured to hold an inspection target and move the inspection target through a position where the beam is irradiated by the primary optical system in a predetermined direction, and a TDI sensor configured to integrate an amount of secondary charged particles in a predetermined direction through a time delay integration to sequentially transfer the integrated amount of secondary charged particles as an integrated detection amount. The secondary charged particles are obtained by irradiating the beam onto the inspection target while moving the movable unit in the predetermined direction. The inspection system further includes a prevention module configured to prevent an arrival of the beam at the inspection target side or an arrival of the secondary charged particles at the TDI sensor during a time period from one transfer to the following transfer after the elapse of a predetermined length of time from the one transfer and until the following transfer.

According to another embodiment of the invention, there is provided an inspection system. The inspection system includes a primary optical system configured to irradiate either of a charged particle and an electromagnetic wave as a beam, and a movable unit configured to hold an inspection target and move the inspection target in a predetermined direction through a position where a beam is irradiated by the primary optical system, and a TDI sensor which has a plurality of imaging elements which are arranged in a predetermined number of stages in a predetermined direction. The TDI sensor is configured to integrate an amount of secondary charged particles in a predetermined direction through a time delay integration to sequentially transfer the integrated amount of secondary charged particles as an integrated detection amount. The secondary charged particles are obtained by irradiating the beam onto the inspection target while moving the movable unit in the predetermined direction. The inspection system further includes an image generation module configured to generate image data based on the integrated detection amount, and a normalization module configured to normalize the integrated detection amount or the image data based on a time required for the movable unit to move a predetermined distance during the integration.

According to another embodiment of the invention, there is provided an inspection display unit. The inspection display unit includes a differential data calculation module configured to compare inspection image data generated based on the results of a detection of an amount of secondary charged particles obtained by irradiating either of a charged particle and an electromagnetic wave as a beam onto an inspection target with reference image data prepared in advance to calculate differential data which reflects a difference between gradation values of corresponding individual pixels that make up the inspection image data and gradation values of individual pixels that make up the reference image data, and a display module configured to display at least one of a numeric matrix configured to reflect the individual values of the differential data and a differential image configured to reflect the individual values of the differential data so that whether the difference on which the calculation of the differential data is based is plus or minus can be identified.

DESCRIPTION OF EMBODIMENTS

1. First Embodiment Group

Figure 1:
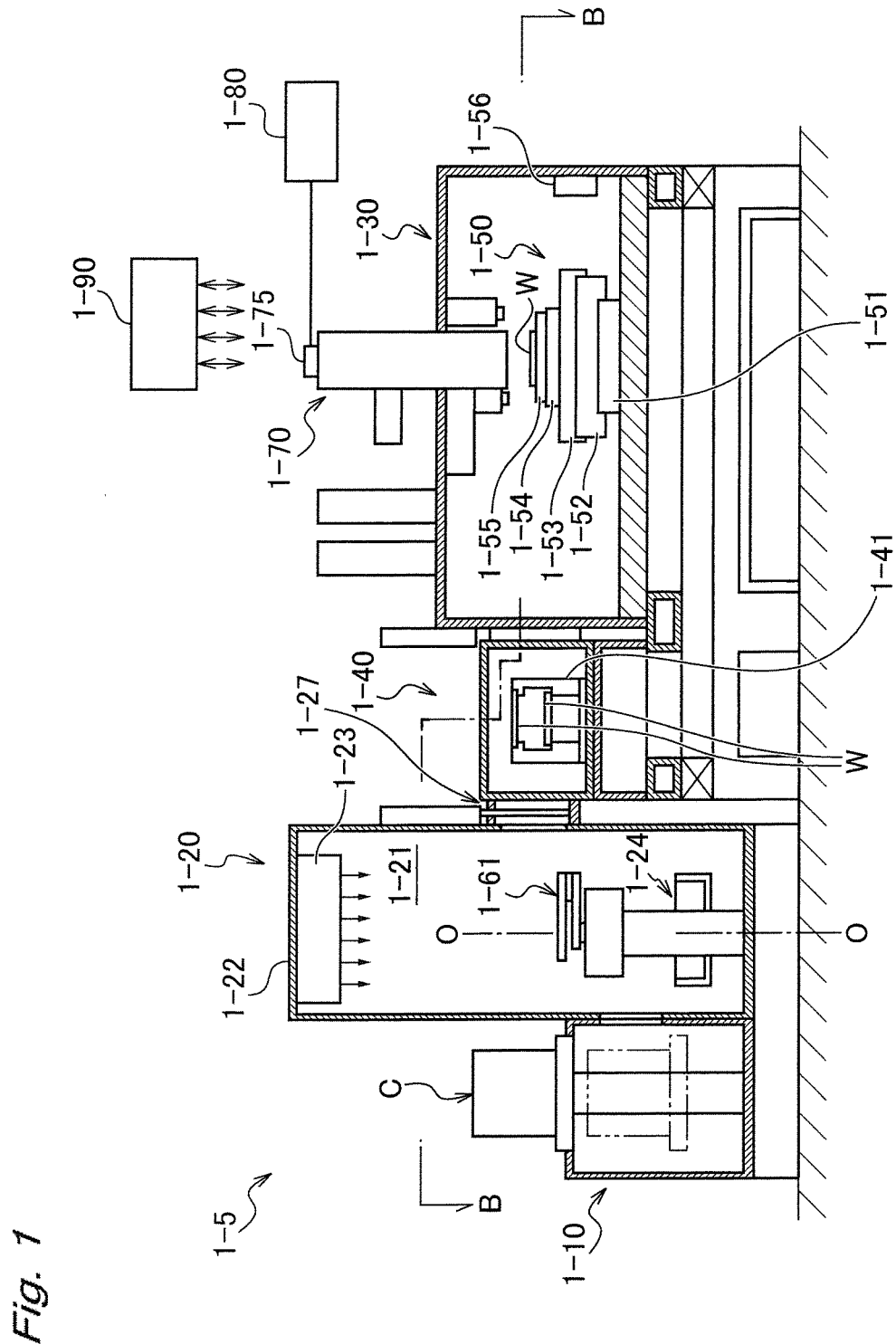
FIG. 1 is a schematic elevation of an inspection system as an embodiment of the invention.

A first embodiment of a first embodiment group of the invention is provided as an inspection system. The inspection system includes a primary optical system configured to irradiate either of a charged particle and an electromagnetic wave as a beam, a movable unit configured to hold an inspection target and move the inspection target through a position where the beam is irradiated by the primary optical system in a predetermined direction, and a TDI sensor configured to integrate an amount of secondary charged particles in a predetermined direction through a time delay integration to sequentially transfer the integrated amount of secondary charged particles as an integrated detection amount. The secondary charged particles are obtained by irradiating the beam onto the inspection target while moving the movable unit in the predetermined direction. The inspection system further includes a prevention module configured to prevent an arrival of the beam at the inspection target side or an arrival of the secondary charged particles at the TDI sensor during a time period from one transfer to the following transfer after the elapse of a predetermined length of time from the one transfer and until the following transfer.

According to the inspection system, in the time period from the one transfer to the following transfer in the TDI sensor, the time during which the inspection target is exposed or the time during which the TDI sensor receives the secondary charged particles becomes constant. Consequently, even though the moving speed of the movable unit varies, it is possible to suppress the generation of unevenness in luminance in the image data which is attributed to the variation in moving speed of the movable unit. As a result, the accuracy of an inspection which utilizes the image data can be increased. The traveling path of secondary charged particles from the inspection target to the TDI sensor is normally provided in a lens tube which is vacuumized. Because of this, in particular, when the prevention module prevents the arrival of the beam at the inspection target side, the prevention module can be provided on an atmosphere side, as a result of which the maintenance of the prevention module can be facilitated.

According to a second embodiment of the first embodiment group, in the first embodiment, the primary optical system irradiates charged particles as the beam. The prevention module deflects the beam to execute blanking and prevents the arrival of the beam at the inspection target side.

According to the embodiment, the amount of beams irradiated onto the inspection target is reduced, and therefore, it is possible to suppress the generation of uneven charge-up in the inspection target.

According to a third embodiment of the first embodiment group, in the first embodiment, the primary optical system irradiates electromagnetic waves as the beam. The prevention module cuts off the beam traveling from the primary optical system towards the inspection target side by an openable and closable shutter configured to cut off the electromagnetic waves to prevent the arrival of the beam at the inspection target side.

According to a fourth embodiment of the first embodiment group, an inspection image data generation method is provided. The method includes irradiating either of a charged particle and an electromagnetic wave as a beam onto an inspection target while moving the inspection target in a predetermined direction, and integrating an amount of secondary charged particles in a predetermined direction through a time delay integration by using a TDI sensor to sequentially transfer the integrated amount of secondary charged particles as an integrated detection amount. Secondary charged particles are obtained by irradiating the beam onto the inspection target. The method further includes preventing an arrival of the beam at the inspection target or an arrival of the secondary charged particles at the TDI sensor during a time period from one transfer to the following transfer after the elapse of a predetermined length of time from the one transfer and until the following transfer, and generating image data based on the integrated detection amount. According to this method, an advantage similar to that provided by the first embodiment is provided.

In addition to the aspects that have been described as being realized above, the embodiments of the invention can be realized in various aspects including an inspection image data generation module, an inspection beam control module, a program for generating inspection image data, and the like. Hereinafter, the first embodiment group of the invention will be described by exemplifying a more specific embodiment.

1-A. Embodiment 1-A

Figure 2:
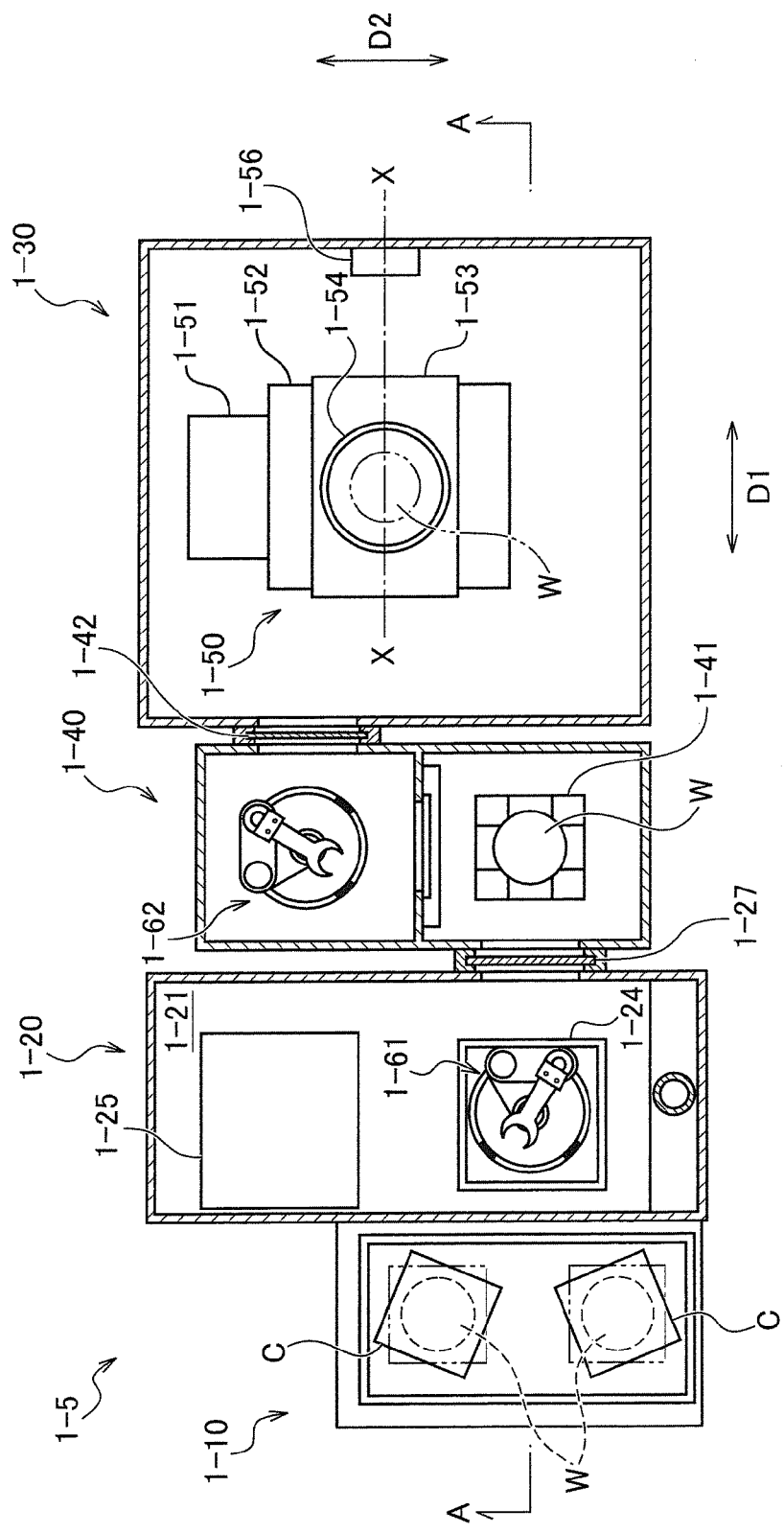
FIG. 2 is a schematic plan view of the inspection system shown in FIG. 1.

FIGS. 1 and 2 show a schematic configuration of a semiconductor inspection system (hereinafter, also referred to simply as an inspection system) 1-5 as an embodiment of an inspection system of the invention. FIG. 1 is a schematic elevation (as viewed in a direction indicated by arrows A-A in FIG. 2) of the inspection apparatus 1-5, and FIG. 2 is a schematic plan view (as viewed in a direction indicated by arrows B-B in FIG. 1) of the inspection system 1-5. The inspection system 1-5 is a system which inspects a pattern formed on a surface of an inspection target for a defect or inspects the surface of the inspection target for a foreign matter existing thereon. A semiconductor wafer, an exposure mask, an EUV mask, a nanoimprinting mask (and a template), an optic element substrate, an optical circuit substrate and the like can be raised as inspection targets. A particle, a cleaning residual (an organic matter), a reaction produce on the surface and the like can be raised as foreign matters. The foreign matters include, for example, an insulating matter, a conductive matter, a semiconductor material or a composite thereof. In the following description, the inspection system 1-5 is described as inspecting a semiconductor wafer (hereinafter, also referred to simply as a waver W). An inspection of a wafer is carried out after the wafer has been treated or in the middle of the treatment of the wafer in a semiconductor fabrication process. The inspection is carried out on such inspection targets as a deposited, CMP treated, or ion injected wafer, a wafer on a surface of which a wiring pattern is formed, a wafer on a surface of which no wiring pattern is formed yet and the like.

As shown in FIG. 1, the inspection system 1-5 includes a cassette holder 1-10, a mini-environment apparatus 1-20, a main housing 1-30, a loader housing 1-40, a stage unit 1-50, an electron optical unit 1-70, an image processing unit 1-80, and a control unit 1-90. As shown in FIGS. 1 and 2, the cassette holder 10 is configured to hold a plurality of (two in FIG. 2) cassettes C. The cassette C stores as inspection targets a plurality of wafers W in such a way as to be aligned parallel in a vertical direction. In this embodiment, the cassette holder 1-10 is configured to automatically set cassettes C in positions indicated by chain lines shown in FIG. 2 on an elevator table. Cassettes C which are set in the cassette holder 1-10 are automatically rotated to positions indicated by solid lines in FIG. 2, that is, positions where the cassettes C are oriented towards a rotating axis O-O (refer to FIG. 1) of a first conveyor unit 1-61 within the mini-environment apparatus 1-20, which will be described later.

As shown in FIGS. 1 and 2, the mini-environment apparatus 1-20 includes a housing 1-22, a gas circulation unit 1-23, a discharge unit 1-24, and a pre-aligner 1-25. A mini-environment space 1-21 is formed in an interior of the housing 1-22, and an atmosphere in the mini-environment space 1-21 is controlled. In addition, the first conveyor unit 1-61 is placed in the interior of the mini-environment space 1-21. The gas circulation unit 1-23 circulates a clean gas (here, air) within the mini-environment space 1-21 to control the atmosphere therein. The discharge unit 1-24 recovers part of air which is supplied into the mini-environment space 1-21 and discharges it to the outside. By doing so, even though dust is produced by the first conveyor unit 1-61, the gas containing the dust is discharged out of the system. The pre-aligner 1-25 roughly positions wafers. The pre-aligner 1-25 is configured to detect an orientation flat formed on the wafer (a flat portion which is formed on an outer circumference of the circular wafer) or one or more V-shaped cutouts or notches which are formed in the outer circumference of the wafer in an optical or mechanical fashion to determine in advance the position of the wafer in a rotating direction about the axis O-O.

The first conveyor unit 1-61 is placed within the mini-environment space 1-21. This first conveyor unit 1-61 has a multi joint arm which can rotate about the axis O-O. This arm is configured to extend and contract in a radial direction. A gripping instrument is provided at a distal end of the arm to grip a wafer W, and this gripping instrument is made up of a mechanical chuck, a vacuum chuck or an electrostatic chuck. The arm can move vertically. The first conveyor unit 1-61 grips a required wafer in the plurality of wafers held within the cassette holder 1-10 and transfers it to a wafer rack 1-41 within the loader housing 1-40, which will be described later.

As shown in FIGS. 1 and 2, the wafer rack 1-41 and a second conveyor unit 1-62 are placed in an interior of the loader housing 1-40. The housing 1-22 of the mini-environment apparatus 1-20 and the loader housing 1-40 are divided by a shutter unit 1-27, and the shutter unit 1-27 is opened only when a wafer W is transferred from the mini-environment apparatus 1-20 to the loader housing 1-40. The wafer rack 1-41 supports a plurality of (two in FIG. 1) wafers W horizontally in such a state that they are spaced apart from each other in a vertical direction. Basically, the second conveyor unit 1-62 has the same configuration as the first conveyor unit 1-61. The second conveyor unit 1-62 transfers a wafer W between the wafer rack 1-41 and a holder 1-55 of the stage unit 1-50, which is described later. The atmosphere in the interior of the loader housing 1-40 is controlled so as to create a high vacuum state (at the degree of vacuum of $10^{-5}$ to $10^{-6}$ Pa), and an inert gas (for example, a dried pure nitrogen gas) is injected thereinto.

As shown in FIGS. 1 and 2, the stage unit 1-50 is provided within the main housing 1-30, as an example of a movable unit which moves a wafer W. The stage unit 1-50 includes a fixed table 1-51 which is disposed on a bottom wall, a Y table 1-52 which moves in a Y direction (also, referred to as a second direction D2) on the fixed table, an X table 1-53 which moves in an X direction (also, referred to as a first direction D1) on the Y table, a turn table 1-54 which can turn on the X table, and a holder 1-55 which is disposed on the turn table 1-54. The Y table is moved in the second direction D2 by an actuator of an arbitrary type (here, a linear motor, not shown). The X table is moved in the first direction D1 by an actuator of an arbitrary type (here, a linear motor, not shown). The holder 1-55 holds a wafer W in a releasable fashion on a resting surface thereof by means of a mechanical or electrostatic chuck. The position of the wafer W held by the holder 1-55 with respect to the first direction D1 is detected by a position measuring unit 1-56. The position measuring unit 1-56 is a laser interferometric distance measuring unit which utilizes the principle of an interferometer and detects a reference position on the resting surface of the holder 1-55 by means of a laser beam of a minute diameter. It is noted that the position of the position measuring unit 1-56 is schematically shown in FIGS. 1 and 2.

The electron optical unit 1-70 irradiates either of a charged particle and an electromagnetic wave as a beam onto a wafer W which is moving in the first direction D1 (refer to FIG. 2) and detects an amount of secondary charged particles which are obtained by the irradiation of the wafer W. The wafer W is moved by the stage unit 1-50. The electron optical unit 1-70 will be described in detail later.

The image processing unit 1-80 shown in FIG. 1 generates image data based on the amount of secondary charged particles detected by the electron optical unit 1-70. The generated image data has a luminance value as a gradation value. In this embodiment, the image processing unit 1-80 includes a memory and a CPU and realizes an image data generating function by executing a program which is stored in advance. It is noted that at least part of functional modules of the image processing unit 1-80 may be made of an exclusive hardware circuit.

The image data generated by the image processing unit 1-80 is used to inspect, by any manner, a pattern formed on a surface of the wafer W for a defect or inspect the surface of the wafer W for existence of a foreign matter thereon. This inspection may be carried out automatically by the use of an information processing unit. For example, the information processing unit may detect an area whose luminance value is equal to or higher than a threshold or may execute a pattern matching between the generated image data and reference image data which is prepared in advance. Alternatively, the inspection may be executed by an inspector, based on an image which is created by the image data or gradation values of individual pixels which make up the image data.

The control unit 1-90 shown in FIG. 1 controls the operation of the inspection system 1-5 in general. For example, the control unit 1-90 issues a moving command to the stage unit 1-50 so that the holder 1-55 which holds a wafer W moves in the first direction D1 at a predetermined moving speed. The control unit 1-90 may include a memory and a CPU to realize required functions by executing a program which is stored therein in advance. Alternatively, in addition to or in place of realizing the required functions through the software, the control unit 1-90 may realize at least part of the required functions by an exclusive hardware circuit.

Figure 3:
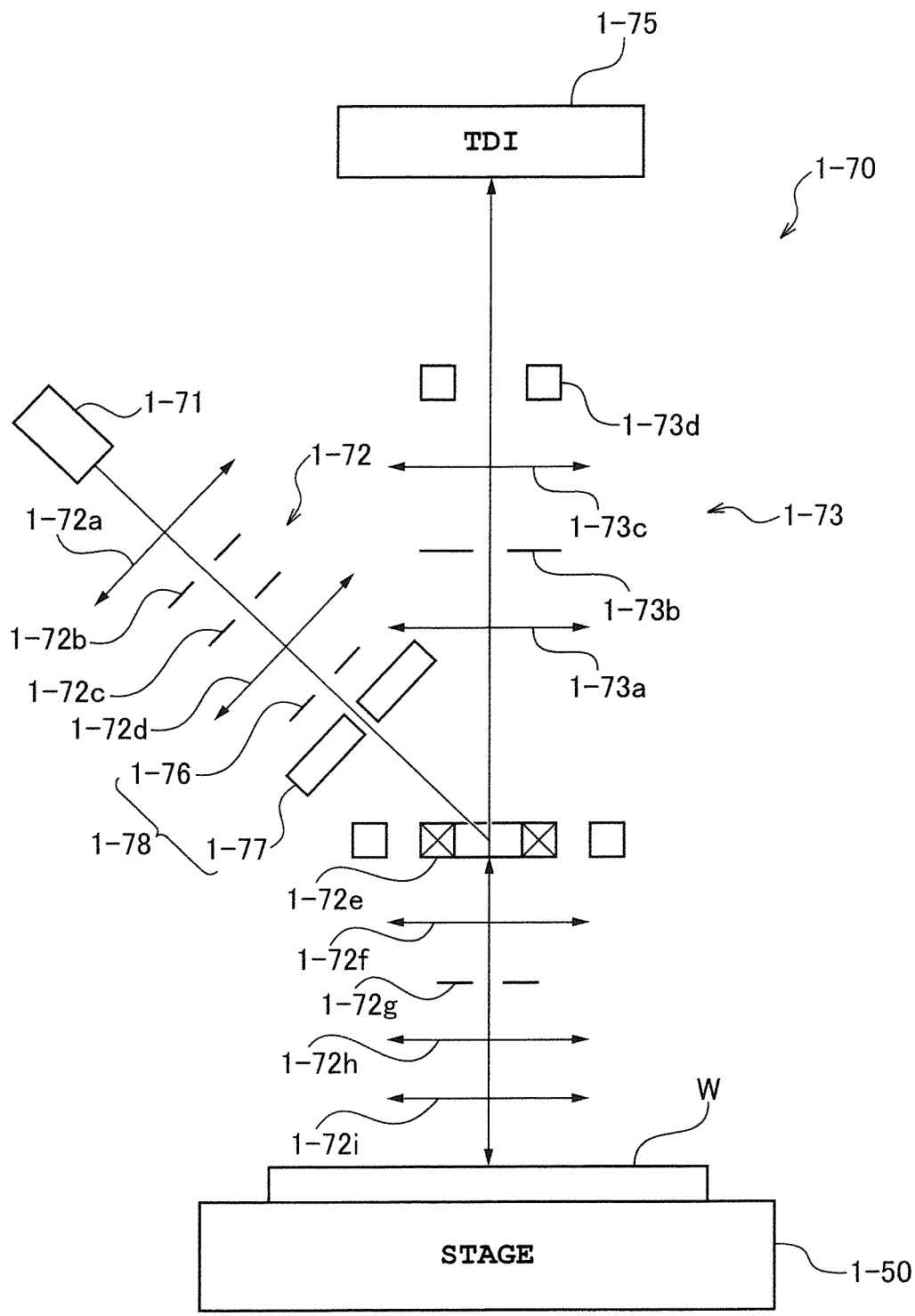
FIG. 3 is an explanatory drawing showing a schematic configuration of an electron optical unit.

FIG. 3 shows a schematic configuration of the electron optical unit 1-70. As shown in FIG. 3, the electron optical unit 1-70 includes a primary optical system 1-72, a secondary optical system 1-73, a TDI sensor 1-75, and a prevention module 1-78. The primary optical system 1-72 generates either of a charged particle and an electromagnetic wave as a beam and irradiates the beam onto the wafer W which is held by the holder 1-55. This primary optical system 1-72 includes a light source 1-71, lenses 1-72a, 1-72d, apertures 1-72b, 1-72c, an ExB filter 1-72e, lenses 1-72f, 1-72h, 1-72i, and an aperture 1-72g. In this embodiment, the light source 1-71 is an electron gun which generates an electron beam. However, the light source 1-71 may be an arbitrary device which generates either a charged particle or an electromagnetic wave which includes, for example, an UV (Ultraviolet) laser, a DUV (Deep Ultraviolet) laser, an EUV (Extreme Ultraviolet) laser, an X-ray laser and the like. It is noted that the configuration of the primary optical system 1-72 and the configuration of the secondary optical system 1-73 described later are modified according to the type of the light source 1-71.

A secondary charged particle is obtained by irradiating the charged particle or the electromagnetic wave onto the wafer W, and the obtained secondary charged particle reflects a state of the wafer W (a condition of a pattern formed thereon, whether or not a foreign matter adheres thereto, or the like). The secondary charged particle is any of a secondary emission electron, a mirror electron and a photoelectron, or a mixing of at least two of these electrons. The secondary emission electron is any of a secondary electron, a reflection electron and a backscattering electron, or a mixing of at least two of these electrons. The secondary emission electron is generated as a result of collision of a charged particle against a surface of a wafer W when the charged particle, that is, an electron beam or the like is irradiated onto the surface of the wafer W. The mirror electron is generated as a result of a charged particle not colliding with a surface of a wafer W but being reflected near the surface when the charged particle, that is, an electron beam or the like is irradiated onto the surface of the wafer W. The photoelectron is generated from a surface of a wafer W when an electromagnetic wave is irradiated onto the surface of the wafer W. In the following description, unless otherwise stated, the wafer W will be inspected for a foreign matter existing thereon.

The lenses 1-72a, 1-72d and the apertures 1-72b, 1-72c shape an electron beam generated by the light source 1-71 and controls the direction of the electron beam so that the electron beam passes through the prevention module 1-78 (which will be described in detail later) and is guided to the ExB filter 1-72e so as to enter it obliquely. The electron beam which has entered the ExB filter 1-72e is subjected to the influence of a Lorentz force generated by magnetic field and electric field to thereby be deflected vertically downwards and is then guided towards the wafer W through the lenses 1-72f, 1-72h, 1-72i and the aperture 1-72g. The lenses 1-72f, 1-72h, 1-72i control the direction of the electron beam and reduces the speed of the electron beam appropriately to regulate the landing energy.

A foreign matter on the wafer W is charged up by irradiating the electron bean onto the wafer W, whereby part of the incident electron is forced backwards without being brought into contact with the wafer W. This guides the mirror electron to the TDI sensor 1-75 through the secondary optical system 1-73. Part of the incident electron is brought into contact with the wafer W, whereby the secondary emission electron is also emitted.

The secondary charged particle (here, the mirror electron and the secondary emission electron) which is obtained by irradiating the electron beam onto the wafer W passes again through the objective lens 1-72*i*, the lens 1-72*h*, the aperture 1-72*g*, the lens 1-72*f* and the ExB filter 1-72*e* and is thereafter guided to the secondary optical system 1-73. The secondary optical system 1-73 guides the secondary charged particle obtained by irradiating the electron beam onto the wafer W to the TDI sensor 1-75. The secondary optical system 1-73 includes lenses 1-73*a*, 1-73*c*, an NA aperture 1-73*b* and an aligner 1-73*d*. In the secondary optical system 1-73, secondary charged particles are collected as a result of passing through the lens 1-73*a*, the NA aperture 1-73*b* and the lens 1-73*c* and are shaped by the aligner 1-73*d*. The NA aperture 1-73*b* has a role of adjusting a transmissivity and aberration of the secondary system.

The TDI sensor has a plurality of imaging elements which are arranged in a predetermined number of stages in the first direction D1 (the X direction) and detects an amount of secondary charged particles which are guided by the secondary optical system 1-73. In this embodiment, the TDI sensor 1-75 also includes imaging elements which are arranged in the second direction D2 (the Y direction). Although the number of imaging elements to be so arranged is arbitrary, it is possible to arrange imaging elements so that (the number of pixels in the X direction, the number of pixels in the Y direction) is one of (2048, 512), (2048, 1024), (2048, 2048), (4096, 1024), (4096, 2048), (4096, 4096), and the like. The inspection at the TDI sensor 1-75 is carried out in such a way that the electron beam is irradiated onto the wafer W while moving the wafer W in the first direction D1 by the stage unit 1-50 and an amount (electric charges) of secondary charged particles is integrated in the first direction D1 by the number of stages in the first direction D1 through the time delay integration. The moving direction of the wafer W and the integrating direction by the TDI sensor 1-75 are the same. The amount of secondary charged particles is integrated stage by stage every time the wafer W moves a distance equal to one pixel in the first direction D1. In other words, electric charges accumulated in one pixel of the TDI sensor 1-75 are transferred to an adjacent pixel every time the wafer W moves the distance equal to one pixel. Then, the detection amount of secondary charged particles which are integrated by the number of stages in the first direction D1, that is, the detection amount which is integrated to a final stage (also, referred to as an integrated detection amount) is transferred to the image processing unit 1-80 every time the holder 1-55 moves the distance equal to one pixel in the first direction D1. The moving amount of the wafer W is detected by the position measuring unit 1-56 described above. Namely, a transfer pulse is sent out to the TDI sensor 1-75 every time the position measuring unit 1-56 detects that the wafer W moves the distance equal to one pixel, and the TDI sensor 1-75 transfer the electric charges at the timing when it receives the transfer pulse.

Luminance data obtained in this way reflects preferably the existence of a foreign matter on the wafer W. This is because since the mirror electrons do not scatter, whereas the secondary emission electrons scatter, the amount of secondary charged particles obtained from an area on the wafer W where a foreign matter exists becomes much larger than the amount of secondary charged particles obtained from other areas. Namely, compared with the area where no foreign matter exists, the area where a foreign matter exists is imaged as an area having a high luminance. However, in reality, it is difficult to maintain strictly constant the moving speed of the wafer W while the integration of amounts of secondary charged particles is being carried out at the TDI sensor 1-75. Because of this, the integrated detection amounts transferred from the TDI sensor 1-75 are such as detected in different exposure times. Therefore, the luminance data obtained by the TDI sensor 1-75 includes unevenness in luminance which is not dependent on the existence of a foreign matter.

In this embodiment, in order to suppress the generation of unevenness in luminance described above, the prevention module 1-78 is provided between the lens 1-72*d* and the ExB filter 1-72*e*. The prevention module 1-78 prevents the arrival of the electron beam at the wafer W side at a predetermined timing. In this embodiment, the prevention module 1-78 includes a blanking electrode 1-76 and a blanking aperture 1-77. The blanking electrode 1-76 executes the blanking of an electron beam which is emitted from the light source 1-71 and which has passed through the lens 1-72*d*. Specifically speaking, the blanking electrode 1-76 deflects the electron beam at high speeds to an outer side of an opening portion of the blanking aperture 1-77 by electrostatic deflection and controls the electron beam so as not to reach the ExB filer 1-72*e*. According to the prevention module 1-78 configured in this way, even though the moving speed of the wafer W is not constant, the exposure time of the wafer W can be controlled to be uniform at every interval when the integrated detection amount is transferred from the TDI sensor 1-75.

A traveling path of the electron beam or the secondary charged particles extending from the ExB filter 1-72*e* to the TDI sensor 1-75 is provided in a lens tube which is vacuumized. As in this embodiment, when the prevention module 1-78 is provided on a traveling path of the electron beam extending from the light source 1-71 to before the wafer W, or more specifically, between the light source 1-71 and the ExB filter 1-72*e*, the prevention portion 1-78 can be provided on an atmosphere side which is outside the lens tube. In case the prevention module 1-78 is provided in such a position, the maintenance of the prevention module 1-78 can be facilitated. Additionally, by providing the prevention module 1-78 on the traveling path of the electron beam extending from the light source 1-71 to before the wafer W, the amount of electron beam irradiated onto the wafer W is reduced. Because of this, the generation of uneven charge-up in the wafer W can be suppressed, as a result of which the pre-charging load can be mitigated.

Figure 4:
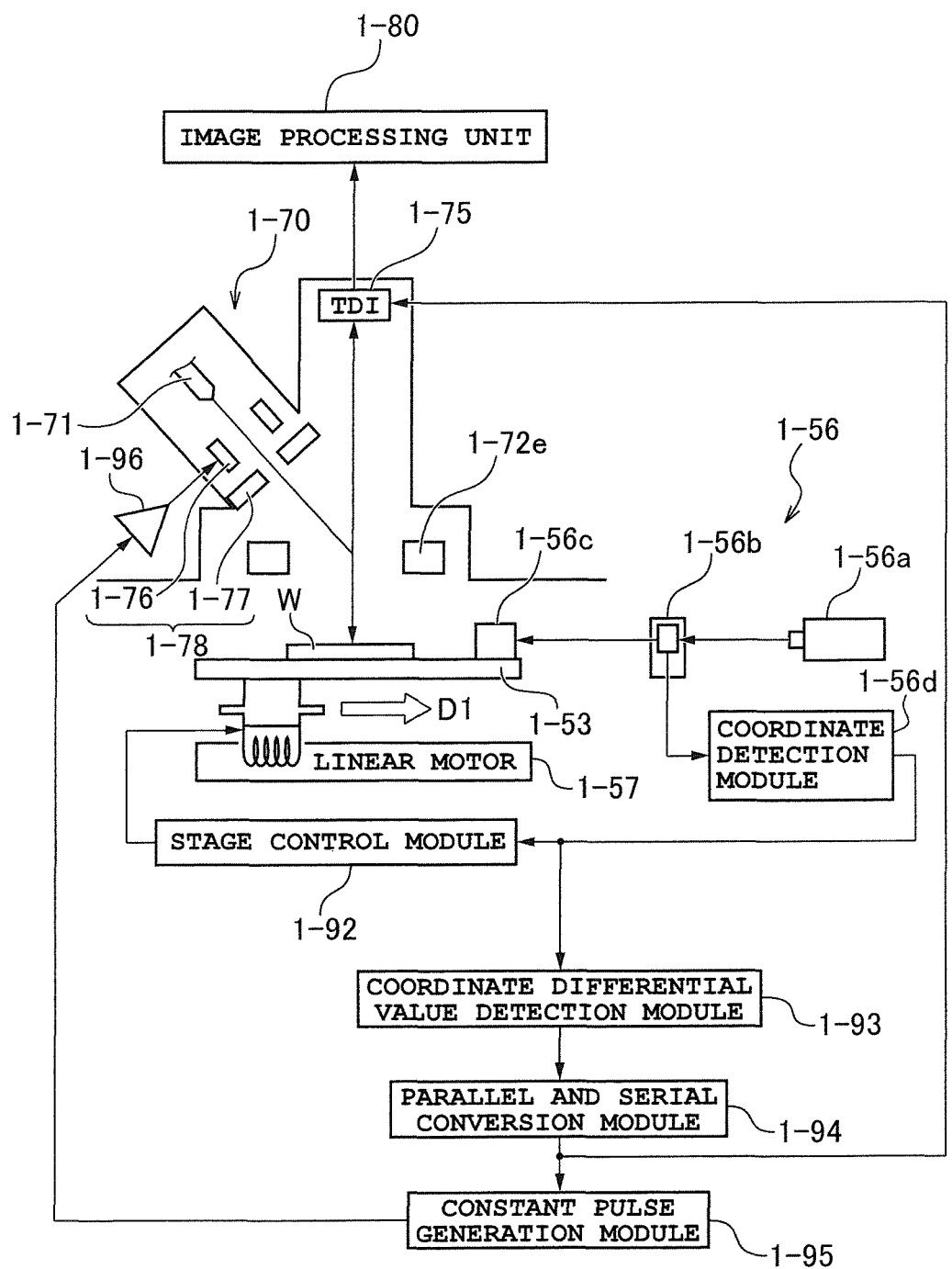
FIG. 4 is an explanatory drawing showing a schematic configuration for controlling an exposure time of an inspection target.

FIG. 4 shows an example of a configuration for controlling the exposure time on the wafer W in the inspection system 1-5. In FIG. 4, the configurations of the stage unit 1-50 and the electron optical unit 1-70 are illustrated schematically. As shown in FIG. 4, the wafer W moves in the first direction D1 as a result of the X table 1-53 is moved by a linear motor 1-57. The moving amount of the wafer W is measured by the position measuring unit 1-56 as has been described above. Specifically speaking, the position measuring unit 1-56 includes a laser oscillator 1-56*a* as a light source, a laser interferometer 1-56*b*, a mirror plate 1-56*c* which is fixed to the X table 1-53 (or the holder 1-55), and a coordinate detection module 1-56*d*. Light emitted from the laser oscillator 1-56*a* passes through the laser interferometer 1-56*b* to be irradiated onto the mirror plate 1-56*c*, and the light reflected thereon returns to the laser interferometer 1-56*b*. The laser interferometer 1-56*b* detects a difference in phase between the incident wave from the laser oscillator 1-56*a* and the reflected wave from the mirror plate 1-56*c* and inputs it into the coordinate detection module 1-56*d*. The coordinate detection module 1-56*d* detects a coordinate of the wafer W or, strictly speaking, the X table 1-53 (or the holder 1-55) based on the phase difference so inputted.

A coordinate value detected by the coordinate detection module 1-56*d* is fed back to a stage control module 1-92 which controls the stage unit 1-50 and is also inputted into a coordinate differential value detection module 1-93. The coordinate differential value detection module 1-93 calculates a difference between the coordinate value inputted this time and the last coordinate value inputted previously and inputs it into a parallel and serial conversion module 1-94. The parallel and serial conversion module 1-94 inputs a serial transfer pulse into the TDI sensor 1-75, based on the coordinate value inputted as a parallel digital value, at the timing when the wafer W moves by the distance corresponding to one pixel of the TDI sensor 1-75. This transfer pulse is also inputted into a constant pulse generation module 1-95.

Every time it receives the transfer pulse, the constant pulse generation module 1-95 inputs a blanking signal into an amplifier 1-96. The blanking signal is a pulse having a pulse width of a constant time. This blanking signal is reversed between a high (H) level and a low (L) level by the amplifier 1-96 o be inputted into the blanking electrode 1-76. When the blanking signal which is at the high level is applied to the blanking electrode 1-76, the blanking electrode 1-76 deflects the electron beam to the outer side of the opening portion in the blanking aperture 1-77. Namely, the electron beam is irradiated towards the wafer W during a time period when the blanking signal is at the high level, while the arrival of the electron beam at the wafer W side is prevented by the blanking electrode 1-76 and the blanking aperture 1-77 during a time period when the blanking signal is at the low level. In this embodiment, the stage control module 1-92, the coordinate differential value detection module 1-93, the parallel and serial conversion module 1-94, and the constant pulse generation module 1-95 are included in the control unit 1-90. However, at least part of these functions may be performed by modules provided separately from the control unit 1-90.

Figure 5:
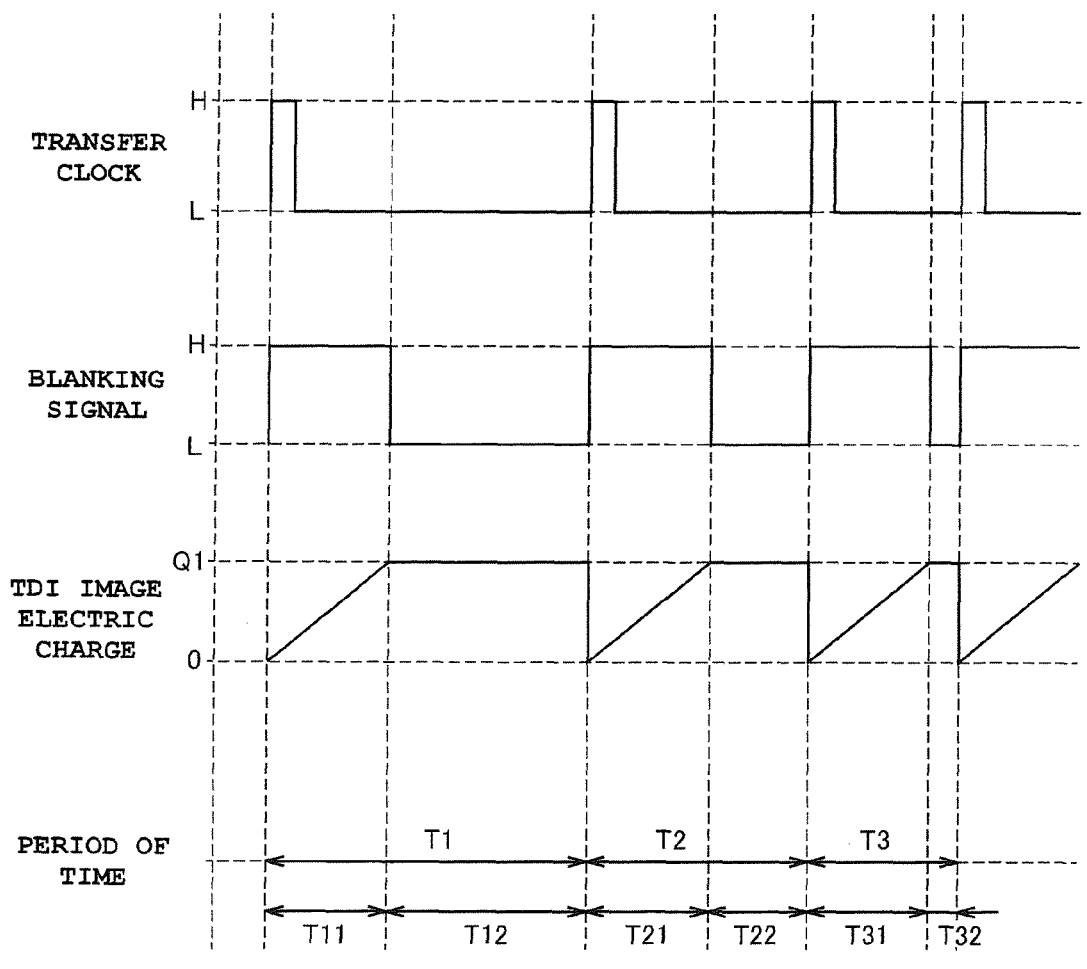
FIG. 5 is a timing chart showing timings at which a beam is irradiated onto an inspection target in the embodiment.

FIG. 5 shows timings when the electron beam is irradiated onto the wafer W. The wafer W here is understood to have no defect or foreign matter attached thereto. Namely, amounts of secondary charged particles obtained from all areas of the wafer W are uniform. As shown in FIG. 5, in a time period T1 from the generation of a first transfer clock to the generation of a second transfer clock which follows the first transfer clock, that is, a time period while the wafer W moves by a distance corresponding to one pixel, the blanking signal stays at the high level during a time period T11 which starts at a timing at which the first transfer clock rises. In this time period T11, since the electron beam is irradiated onto the wafer W, an amount of electric charges accumulated in a first pixel of the TDI sensor 1-75 increases at a constant speed from zero to an electric charge Q1. Thereafter, in the remaining time period T12 in the time period T1, since the blanking signal stays at the low level, the arrival of the electron beam at the wafer W side is prevented. Because of this, in the time period T12, the amount of electric charges accumulated in the first pixel of the TDI sensor 1-75 is maintained at the electric charge Q1. Since this electric charge Q1 is transferred to a second pixel lying adjacent to the first pixel when a second transfer clock is generated, the amount of electric charges is reset to zero when a time period T2 starts which extends from the generation of the second transfer clock until the generation of a third transfer clock. In this example, the time period T2 is shorter than the time period T1. Namely, the moving speed of the wafer W is varying.

Next, in the time period T2, the blanking signal stays at the high level during a time period T21 which starts at a timing when the second transfer clock rises. As has been described above, since the pulse width of the blanking signal is constant, the time period T11 and the time period T21 are the same in team of length. Because of this, in the time period T21, as in the case with the time period T11, the amount of electric charges accumulated in the first pixel increases at the constant speed from zero to the electric charge Q1. Thereafter, in the remaining time period T22 in the time period T2, since the blanking signal stays at the low level, the arrival of the electron beam at the wafer W side is prevented. Because of this, the amount of electric charges accumulated in the first pixel remains at the electric charge Q1 and is transferred to the second pixel after the elapse of the time period T2. Although a description thereof is omitted, also, in a time period T3 that is shorter than the time period T2, the electric charge Q1 is accumulated in the first pixel. Although the rise of the transfer clock and the rise of the blanking signal are described as occurring at the same time in this example, the blanking signal may rise after the elapse of a certain time period since the rise of the transfer clock.

In this way, in this embodiment, irrespective of the moving speed of the wafer W, the time while the electron beam is irradiated onto the wafer W becomes constant. As a result of this, when there is no area distribution in the surface properties of the wafer W, the amount of electric charges accumulated in the pixels of the TDI sensor 1-75 becomes constant. Consequently, the generation of unevenness in luminance in image data is suppressed, whereby the inspection accuracy of the wafer W is improved.

Figure 6:
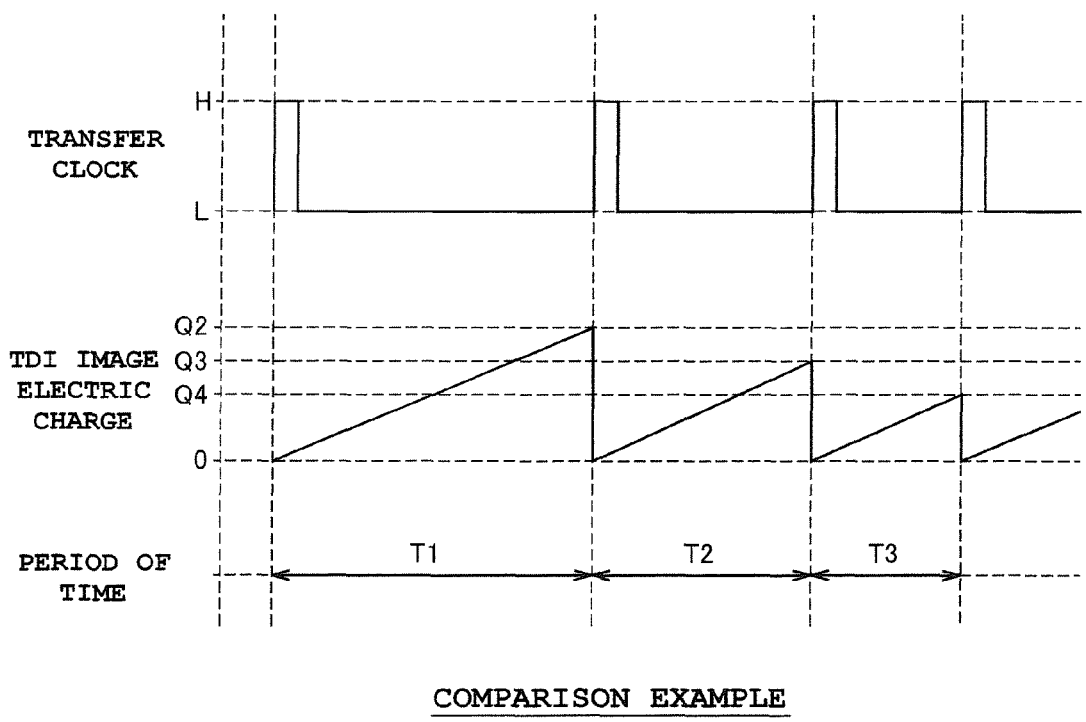
FIG. 6 is a timing chart showing timings at which a beam is irradiated onto an inspection target in a comparison example.

On the other hand, when the inspection system 1-5 does not have the prevention module 1-78, as shown in FIG. 6, electric charges Q2, Q3, Q4 which are accumulated in the first pixel in time periods T1, T2, T3 are proportional to the exposure time and Q2>Q3>Q4. Namely, even in the case of there being no area distribution in the surface properties of the wafer W, the moving speed of the wafer W varies, whereby the amount of electric charges does not stay constant.

In the inspection system 1-5 described heretofore, it is desirable that in consideration of a variation in time required for the wafer W to move by the distance corresponding to one pixel of the TDI sensor 1-75, the pulse width of the blanking signal is set to be as wide as possible within a range which does not exceed a minimum value of the variation range. By adopting this setting, it is possible to extend the exposure time within the range where the exposure time of the wafer W in the individual positions thereof can be maintained uniform. As a result of this, a sensitive imaging is executed at the TDI sensor 1-75. Normally, the speed variation of the stage unit 1-50 falls within a range of 1% to 0.1%. In many cases, the value of this speed variation is specified based on a maximum speed, and the speed variation increases as the moving speed of the stage unit 1-50 slows. For example, when the moving speed is 30 minis and the degree of variability of moving speed is 1%, in many stage units, the degree of variability of moving speed becomes roughly 10% when the moving speed is 3 mm/s. As one of factors which cause this, the fact is raised that the loop gain of the servo is constant irrespective of moving speed. In order to maintain the luminance constant irrespective of the degree of variability of moving speed, it is desirable that the pulse width of the blanking signal is determined in consideration of the period of the transfer pulse of the TDI sensor 1-75 which is shortened by the variation in moving speed. Additionally, in order to ensure the number of secondary charged particles to be detected, it is desirable that the irradiating time in one period is extended as long as possible, Assuming that the average transfer pulse period when the moving speed is slow is t1, the range of the transfer pulse period becomes t1±10%. Although there is no problem in case the transfer pulse period is long, when the transfer pulse period is set to be short, there may be caused a situation in which the variation cannot be absorbed. In addition, it is desirable that the rising time and falling time of the pulse and the response time of the blanking mechanism be taken into consideration. Then, it is considered that for example, roughly 80% of the average transfer pulse period is allocated to the irradiating time in one period, that is, to the pulse width of the blanking signal, while the remaining 20% is allocated to a margin for absorbing the variation in moving speed. Of course, this ratio results when the degree of variability of stage moving speed is taken as a certain example to enable the absorption of the variation in moving speed. When a stage is used whose degree of variability in moving speed is smaller, suitable values may be applied thereto based on the same consideration.

1-B. Modified Embodiment 1-B

1-B-1. Modified Embodiment 1-B-1

The inspection system 1-5 may include a monitoring module which monitors the moving speed of the wafer W, in other words, the moving speed of the holder 1-55 or the X table 1-53. The moving speed can easily be grasped by using the results of a measurement by the position measuring unit 1-56. Additionally, the inspection system 1-5 may include a setting module which sets the pulse width of the blanking signal based on the results of the monitoring of the moving speed of the holder 1-55 or the X table 1-53 by the monitoring module. This setting module may try to move the X table 1-53 before the wafer W is imaged so as to set the pulse width of the blanking signal based on the results of the monitoring by the monitoring module during the trial movement. According to this configuration, in mass producing inspection systems 1-5, the pulse width of the blanking signal can be set to a preferred value according to individual differences in moving properties of X tables 1-53. Alternatively, the pulse width of the blanking signal may be reset based on the results of the monitoring by the monitoring module carried out until then at a predetermined timing, for example, every predetermined time period or every time a predetermined number of wafers W are imaged. According to this configuration, even when a variation is caused in the moving properties of the X table 1-53, the pulse width of the blanking signal can be set to a preferred value. The monitoring module and the setting module may be configured as part of the control unit 1-90.

1-B-2. Modified Embodiment 2

The position of the prevention module 1-78 is not limited to the position described in the embodiment above, and hence, the prevention module 1-78 may be provided in any position as long as either of the arrival of the electron beam at the wafer W side and the arrival of the secondary charged particle at the TDI sensor 1-75 is realized in that position. For example, the prevention module 1-78 may be provided between the TDI sensor 1-75 and the secondary optical system 1-73 or may be provided between the stage unit 1-50 and the secondary optical system 1-73.

1-B-3. Modified Embodiment 3

The prevention module 1-78 can have, in place of the blanking module, any configuration which can prevent the arrival of the beam at the wafer W side or the arrival of the secondary charged particle at the TDI sensor 1-75. For example, when an electromagnetic wave is emitted from the light source 1-71, the prevention module 1-78 may be an openable and closable shutter which cuts off electromagnetic waves.

1-B-4. Modified Embodiment 1-B-4

The integrating direction in the TDI sensor 1-75 is not limited to the first direction D1 and hence may be the second direction D2. In this case, the charged particle or electromagnetic wave may be irradiated onto the wafer W while moving the wafer W in the second direction D2.

2. Second Embodiment Group

A first embodiment of a second embodiment group of the invention is provided as an inspection system. The inspection system includes a primary optical system configured to irradiate either of a charged particle and an electromagnetic wave as a beam, and a movable unit configured to hold an inspection target and move the inspection target in a predetermined direction through a position where a beam is irradiated by the primary optical system, and a TDI sensor which has a plurality of imaging elements which are arranged in a predetermined number of stages in a predetermined direction. The TDI sensor is configured to integrate an amount of secondary charged particles in a predetermined direction through a time delay integration to sequentially transfer the integrated amount of secondary charged particles as an integrated detection amount. The secondary charged particles are obtained by irradiating the beam onto the inspection target while moving the movable unit in the predetermined direction. The inspection system further includes an image generation module configured to generate image data based on the integrated detection amount, and a normalization module configured to normalize the integrated detection amount or the image data based on a time required for the movable unit to move a predetermined distance during the integration.

According to the inspection system configured in the way described above, even though the moving speed of the movable unit varies, that is, even though the exposure time of the inspection target varies, it is possible to generate image data which is less influenced by the variation in moving speed or exposure time. As a result of this, the accuracy of the inspection utilizing the image data can be improved.

According to a second embodiment of the second embodiment group, in the first embodiment, the normalization module is configured to subtract an offset amount which is determined in advance from the integrated detection amount or a gradation value of the image data before or after the normalization, in addition to the normalization. According to this embodiment, it is possible to generate highly accurate image data which is less influenced by dark current noise. As a result of this, the accuracy of the inspection utilizing the image data can be improved.

According to a third embodiment of the second embodiment group, in the first or second embodiment, the TDI sensor includes a plurality of imaging element groups, each of which includes a plurality of imaging elements which are arranged in a predetermined number of stages in a predetermined direction. The imaging element groups are arranged in a plurality of stages in a direction perpendicular to the predetermined direction. In addition to the normalization, the normalization module is configured to multiply the integrated detection amount or a gradation value of the image data before or after the normalization by an increase or decrease ratio which is determined for each of imaging element groups. According to this embodiment, it is possible to correct a variation in received light sensitivity of each of the imaging element groups which are arranged in the plurality of stages in the direction perpendicular to the predetermined direction. As a result of this, the accuracy of the inspection utilizing the image data can be improved.

According to a fourth embodiment of the second embodiment group, in any one of the first to third embodiments, the normalization module normalizes the integrated detection value which is expressed by a digital value. According to this embodiment, the normalizing operation can be facilitated.

According to a fifth embodiment of the second embodiment group, in any one of the first to third embodiments, the normalization module normalizes the integrated detection value which is expressed by an analog value. According to this embodiment, since the normalization is executed in such a state that no quantization error is contained, compared with the fourth embodiment, the accuracy of image data can be enhanced.

According to a sixth embodiment of the second embodiment group, in any one of the first to fifth embodiments, the predetermined distance is a distance which corresponds to the plurality of imaging elements which are arranged in the predetermined number of stages. According to this embodiment, since the integrated detection amount is normalized by using the whole of the time required to integrate the integrated detection amount that is transferred, the accuracy of normalization is enhanced, thereby making it possible to generate image data which is far less influenced by the variation in exposure time of the inspection target.

According to a seventh embodiment of the second embodiment group, an inspection image data generation method is provided. The method includes irradiating either of a charged particle and an electromagnetic wave as a beam while moving an inspection target in a predetermined direction, integrating an amount of secondary charged particles which are obtained by irradiating the beam onto the inspection target in a predetermined direction through a time delay integration to detect the resulting amount of secondary charged particles as an integrated detection amount by using a TDI sensor which has a plurality of imaging elements which are arranged in a predetermined number of stages in a predetermined direction, generating image data based on the integrated detection amount, and normalizing the integrated detection amount or the image data based on a time required for the inspection target to move a predetermined distance during the integration. According to this embodiment, the same advantage as that of the first embodiment is provided. It is also possible to add any one of the second to sixth embodiments to the seventh embodiment.

In addition to the aspects that have been described as being realized above, the embodiments of the invention can be realized in various aspects including an inspection image data generation module, an inspection image data normalization module, a program for generating inspection image data, and the like. Hereinafter, the second embodiment group of the invention will be described by reference to a more specific embodiment.

2-A. Embodiment 2-A

Figure 7:
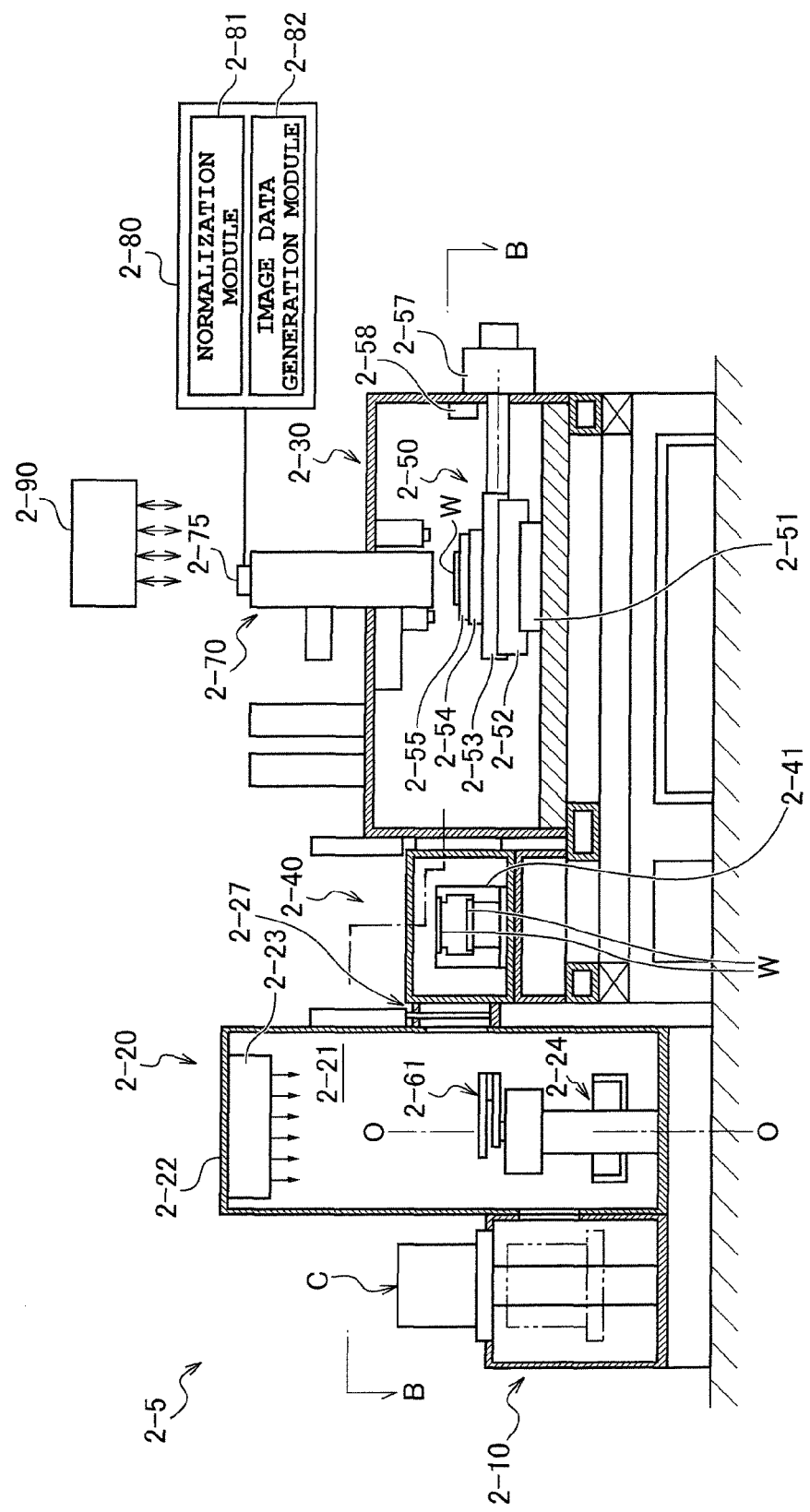
FIG. 7 is a schematic elevation of an inspection system of another embodiment of the invention.
Figure 8:
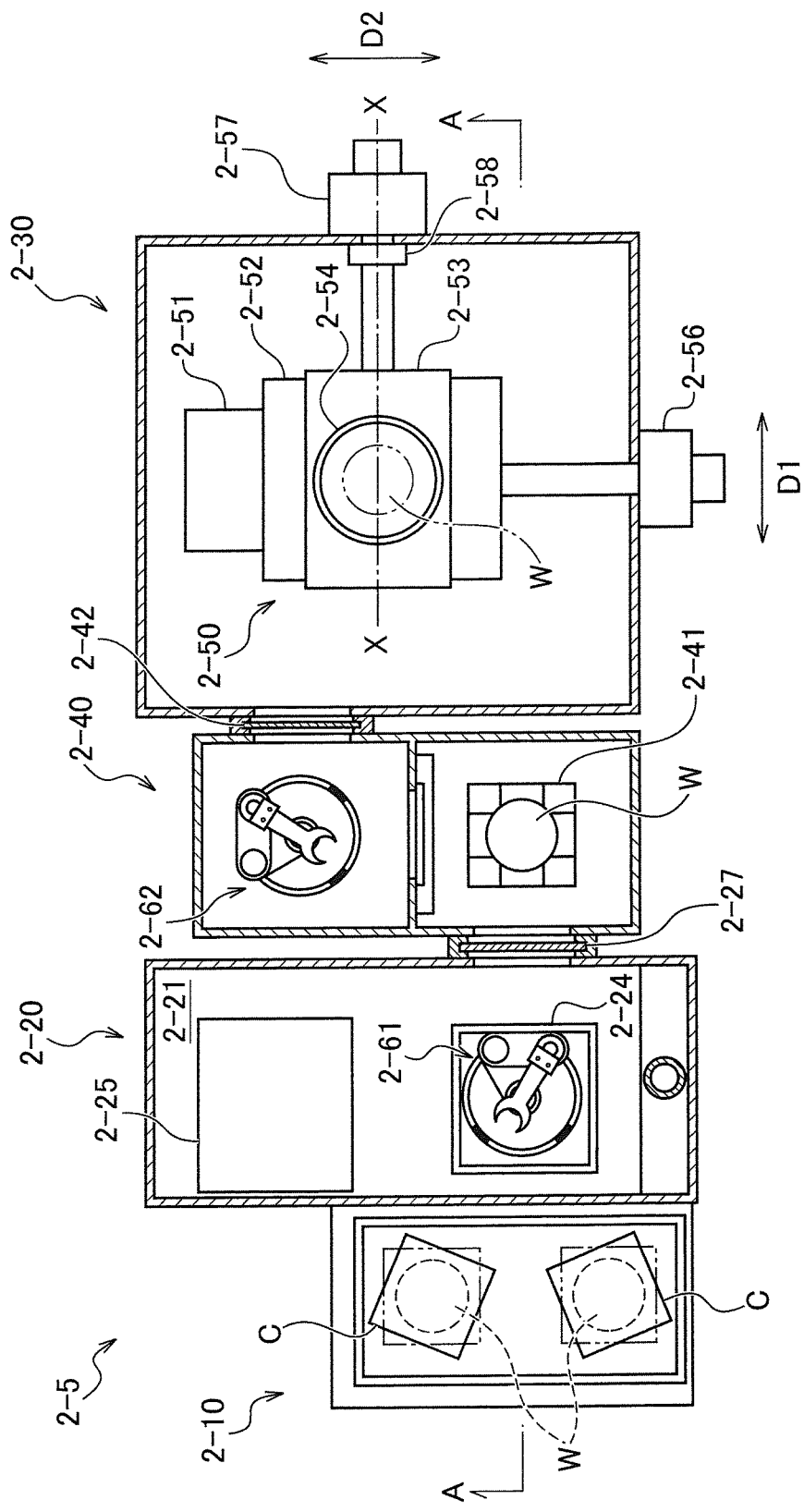
FIG. 8 is a schematic plan view of the inspection system shown in FIG. 7.

FIGS. 7 and 8 show a schematic configuration of a semiconductor inspection system (hereinafter, also referred to simply as an inspection system) 2-5 as an embodiment of an inspection system of the invention. FIG. 7 is a schematic elevation (as viewed in a direction indicated by arrows A-A in FIG. 8) of the inspection apparatus 2-5, and FIG. 8 is a schematic plan view (as viewed in a direction indicated by arrows B-B in FIG. 7) of the inspection system 2-5. The inspection system 2-5 is a system which inspects a pattern formed on a surface of an inspection target for a defect or inspects the surface of the inspection target for a foreign matter existing thereon.

As shown in FIG. 7, the inspection system 2-5 includes a cassette holder 2-10, a mini-environment apparatus 2-20, a main housing 2-30, a loader housing 2-40, a stage unit 2-50, an electron optical unit 2-70, an image processing unit 2-80, and a control unit 2-90. The configurations of the cassette holder 2-10, the mini-environment apparatus 2-20, the main housing 2-30 and the loader housing 2-40 are the same as those of Embodiment 1-A. Because of this, in this embodiment, like reference numerals which are like to those of Embodiment 1-A in last two digits will be given to like constituent elements to those of Embodiment 1-A, and a detailed description thereof will be omitted here.

As shown in FIGS. 7 and 8, the stage unit 2-50 is provided within the main housing 2-30, as an example of a movable unit which moves a wafer W. The stage unit 2-50 includes a fixed table 2-51 which is disposed on a bottom wall, a Y table 2-52 which moves in a Y direction (also, referred to as a second direction D2) on the fixed table, an X table 2-53 which moves in an X direction (also, referred to as a first direction D1) on the Y table, a turn table 2-54 which can turn on the X table, and a holder 2-55 which is disposed on the turn table 2-54. The Y table 2-52 is moved in the second direction D2 by a servo motor 2-56 which is an actuator provided outside the main housing 2-30. The X table 2-53 is moved in the first direction D1 by a servo motor 2-57 which is an actuator provided outside of the main housing 2-30. The holder 2-55 holds a wafer W in a releasable fashion on a resting surface thereof by means of a mechanical or electrostatic chuck. The position of the wafer W held by the holder 2-55 with respect to the first direction D1 is detected by a position measuring unit (a position sensor) 2-58. The position sensor 2-58 is a laser interferometric distance measuring unit which utilizes the principle of an interferometer and detects a reference position on the resting surface of the holder 2-55 by means of a laser beam of a minute diameter. It is noted that the position of the position sensor 2-58 is schematically shown in FIGS. 7 and 8. The position measuring unit 2-58 irradiates a laser beam towards, for example, a mirror plate which is fixed to the X table 2-53 (or the holder 2-55) and detects a coordinate of the wafer W or, strictly speaking, the X table 2-53 (or the holder 2-55) by a laser interferometer based on a difference in phase between an incident wave of the laser and a reflection wave reflected from the mirror plate. The laser interferometer may be provided in an interior of the main housing 2-30 or may be provided outside thereof. Additionally, the laser interferometer may be provided in a position which lies away from the main housing 2-30 by being connected via an optical cable to an optical pickup which is provided in an optical path of the laser.

The electron optical unit 2-70 irradiates either of a charged particle and an electromagnetic wave as a beam onto a wafer W which is moving in the first direction D1 (refer to FIG. 8) and detects an amount of secondary charged particles which are obtained by the irradiation of the wafer W. The wafer W is moved by the stage unit 2-50. The electron optical unit 2-70 will be described in detail later.

The image processing unit 2-80 shown in FIG. 7 generates image data based on the amount of secondary charged particles obtained by the electron optical unit 2-70. The generated image data has a luminance value as a gradation value. In this embodiment, the image processing unit 2-80 includes a memory and a CPU and functions as a normalization module 2-81 and an image data generation module 2-82 by executing a program which is stored in advance. These functions will be described later. It is noted that at least part of the functional modules of the image processing unit 2-80 may be made of an exclusive hardware circuit.

The control unit 2-90 shown in FIG. 7 controls the operation of the inspection system 2-5 in general. For example, the control unit 2-90 issues a moving command to the stage unit 2-50 (more specifically, to the servo motor 2-57) so that the holder 2-55 which holds a wafer W moves in the first direction D1 at a predetermined moving speed.

Figure 9:
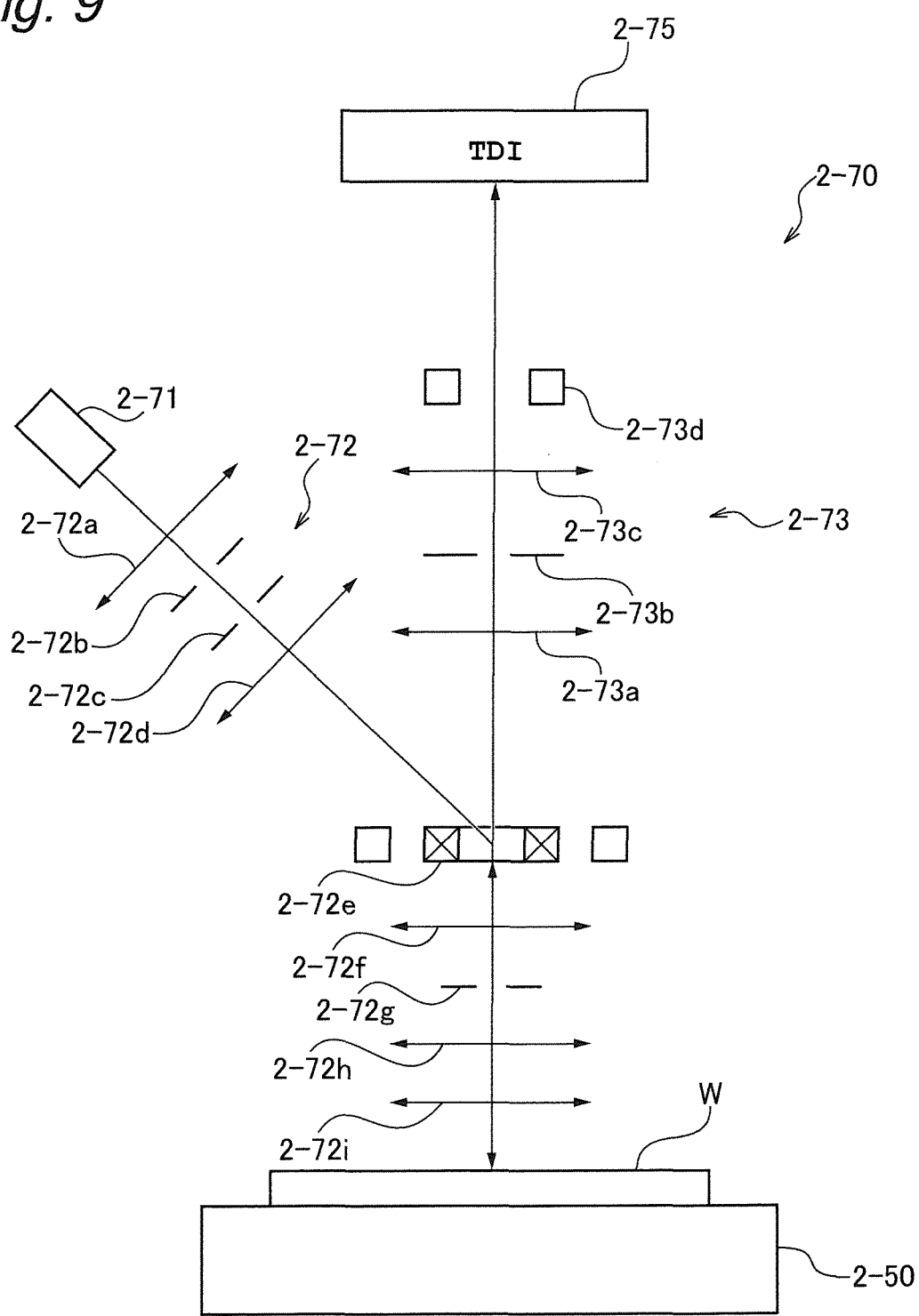
FIG. 9 is an explanatory drawing showing a schematic configuration of an electron optical unit.

FIG. 9 shows a schematic configuration of the electron optical unit 2-70. The electron optical unit 2-70 differs from that of the first embodiment only in that the former unit does not include the prevention module 1-78 (refer to FIG. 3) of the first embodiment. Because of this, like reference numerals which are like to those of the first embodiment in last two digits will be given to like constituent elements to those of the first embodiment, and a detailed description thereof will be omitted here. In this embodiment, a TDI sensor 2-75 incorporates an A/D conversion circuit and A/D converts an integrated detection amount of secondary charged particles for transmission to the image processing unit 2-80 as a digital value expressing a luminance.

Figure 10:
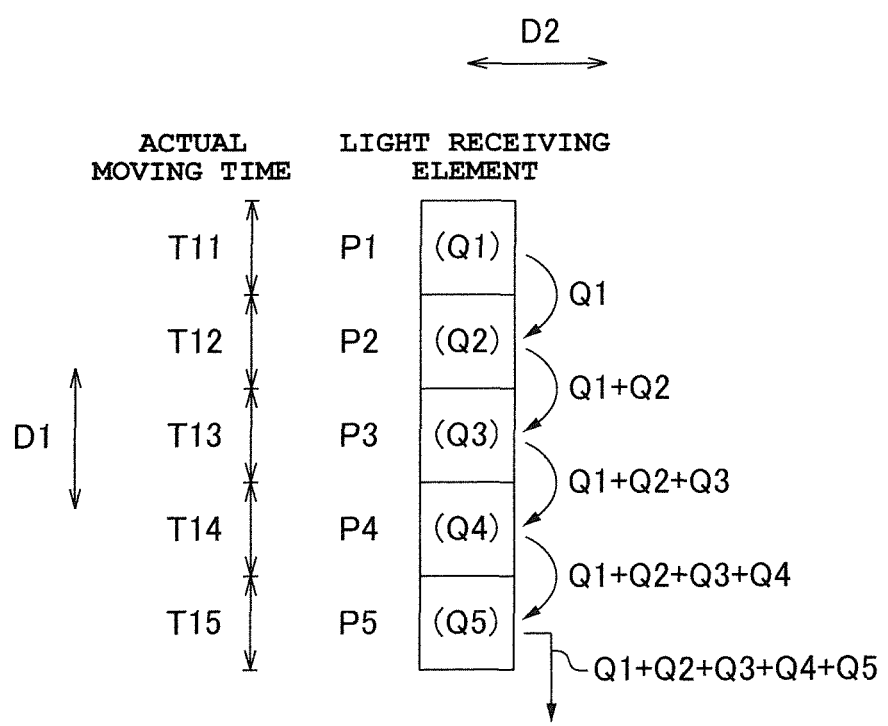
FIG. 10 is an explanatory diagram showing schematically how amounts of secondary charged particles are integrated in a TDI sensor.

FIG. 10 shows schematically how the TDI sensor 2-75 integrates an amount of secondary charged particles. Since the configuration of the TDI sensor is generally known, only how to integrate the amount of secondary charged particles will be described here. Here, as a matter of convenience of description, the TDI sensor 2-75 is described as having five imaging elements which are arranged in five stages in the first direction D1 and no imaging element which is arranged in the second direction D2. In FIG. 10, P1 to P5 denote imaging elements (pixels) which are arranged in the first direction D1. In an illustrated example, when detection is executed by the TDI sensor 2-75, a wafer W is moved in a direction directed from the pixel P1 towards the pixel P5. In FIG. 10, T11 to T15 denote times (time periods) actually required for the wafer W to move a distance corresponding to one pixel. For example, a time T11 is a time required for the wafer W to move a distance corresponding to the pixel P1, and a time T12 is a time required for the wafer W to move a distance corresponding to the pixel P2.

As shown in FIG. 10, in the detection by the TDI sensor 2-75, firstly, an electric charge Q1 which corresponds to an amount of detected secondary electric particles is accumulated in the pixel P1 during the time T11. This electric charge Q1 is transferred to the pixel P2 which lies adjacent to the pixel P1 in accordance with a transfer clock which is inputted into the TDI sensor 2-75 at the timing when the time T11 has just elapsed. An electric charge Q2 is accumulated in the pixel P2 in addition to the electric charge Q1 during the time T12 which follows the time T11. As a result of this, the electric charges Q1+Q2 are accumulated in the pixel P2 by the time when the time T12 has elapsed. The electric charges Q1+Q2 are transferred to the pixel P3 at the timing when the time T12 has just elapsed. An electric charge Q3 is accumulated in the pixel P3 in addition to the electric charges Q1+Q2 which have been transferred from the pixel P2 during the time T13 which follows the time T12. As a result of this, the electric charges Q1+Q2+Q3 are accumulated in the pixel P3 by the time when the time T13 has elapsed. In this way, as a result of the electric charges being accumulated sequentially, the electric charges Q1+Q2+Q3+Q4+Q5 are accumulated in the pixel P5 after the times T11 to T15 have elapsed and are then transferred to the image processing unit 2-80. In this way, as a result of the amount of secondary charged particles obtained from the same area of the wafer W being accumulated, even though the wafer W is moved at high speeds in the first direction D1, a sufficient exposure time is ensured as a whole, whereby sensitive imaging data is obtained.

The inspection system 2-5 of this embodiment is configured to correct the unevenness in luminance described above. More specifically, the integrated detection value transferred to the image processing unit 2-80 by the TDI sensor 2-75 is normalized by a normalization module 2-81 of the image processing unit 2-80. When referred to herein, the normalization is a process of correcting the integrated detection amount so that the influence on the integrated detection value (the unevenness in luminance), which is caused by the variation in moving speed of the wafer W (the X table 2-53), that is, the variation in exposure time of the wafer W, is mitigated. This normalization process is executed based on the time required for the wafer W to move by a predetermined distance in the first direction D1 during the integration at the TDI sensor 2-75. More specifically, the normalization process is executed based on the following expression (1) by the use of a normalization coefficient K which is a ratio between an actual moving time Tn and a target moving time T0. IV0 is an integrated detection amount before normalization, and IV1 is an integrated detection value after normalization.

$$IV1 = K \times IV0 \qquad (1)$$

The normalization coefficient K is calculated by the following expression (2). Tn is a time actually required for the wafer W to move by the predetermined distance (hereinafter, also, referred to as an actual moving time). In this embodiment, the predetermined distance is a distance which corresponds to the pixels of the TDI sensor 2-75 which are arranged in the predetermined number of stages in the first direction D1 (a distance corresponding to five pixels in the example shown in FIG. 10). Because of this, the actual moving time Tn equals the exposure time corresponding to the integrated detection amount which is transferred from the TDI sensor 2-75. The target moving time T0 is a time estimated in advance as a time required for the wafer W to move the predetermined distance (hereinafter, also, referred to as the target moving time). The target moving time T0 may be taken as a design value for the time required for the wafer W to move the predetermined distance.

$$K = T0/Tn \qquad (2)$$

The integrated detection amount that is normalized in this way by the normalization module 2-81 is outputted to the image data generation module 2-82. The image data generation module 2-82 composites the integrated detection values that the image data generation module 2-82 has received from the normalization module 2-81 to generate image data which is made up of gradation values (luminance values) arranged in the first direction D1 and the second direction D2. The image data generated in this way is used for inspection of the existence of a foreign matter by an arbitrary method. This inspection may be executed automatically by the use of an information processing unit. For example, the information processing unit may detect an area where the luminance value is equal to or higher than a threshold or may execute a matching between the generated image data and reference image data which is prepared in advance. Alternatively, the inspection may be executed by an inspector based on gradation values of the individual pixels which make up the image data. It is noted that the sequence of executing the normalization process and the image data generation process may be reversed. Namely, the image data generation module 2-82 may first generate image data by compositing the data which is transferred from the TDI sensor 2-75, and thereafter, the normalization module 2-81 may normalize the image data so generated.

Figure 11:
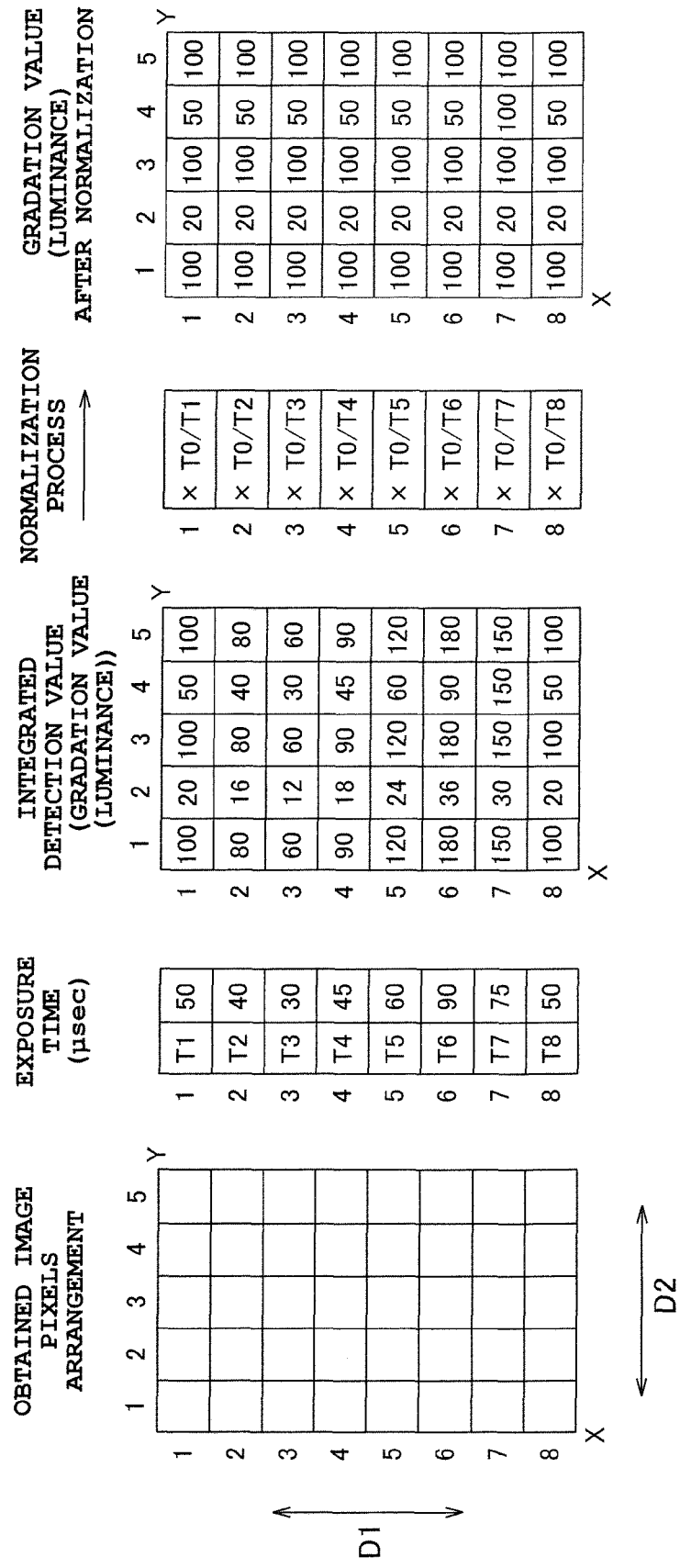
FIGS. 11(A) to 11(E) are explanatory drawings showing a concrete example of normalizing.

FIGS. 11(A) to 11(E) show a specific example of a normalization process. In this example, image data is first generated, and thereafter, the generated image data is normalized. FIG. 11(A) shows a pixel arrangement of image data before normalization. A pixel group of X=1 is a pixel group whose electric charges are transferred first to the image processing unit 2-80 by the TDI sensor 2-75. A pixel group of X=2 is a pixel group whose electric charges are transferred next to the pixel group of X=1. Namely, an arrangement of numbers in an X direction denotes the transfer order from the TDI sensor 2-75. FIG. 11(B) shows a total exposure time for each of pixel groups arranged in a Y direction. For example, an exposure time T1 is a total value of the times T11 to T15 shown in FIG. 10. Namely, the exposure time T1 corresponds to the actual moving time Tn described above. FIG. 11(C) shows gradation values of the individual pixels which make up the image data generated by compositing the integrated detection values. Namely, FIG. 11(C) shows the integrated detection amounts IV0 before normalization. The integrated detection amounts IV0 (gradation values) before normalization are luminance values of 256 gradations here. FIG. 11(D) show normalization coefficients K which are applied to a pixel group of X=n (here, n is an integer from 1 to 8). FIG. 11(E) shows integrated detection values IV1 after normalization which are calculated by the expression (2) based on the integrated detection amounts IV0 shown in FIG. 11(C) and the normalization coefficients K shown in FIG. 11(D).

Figure 12:
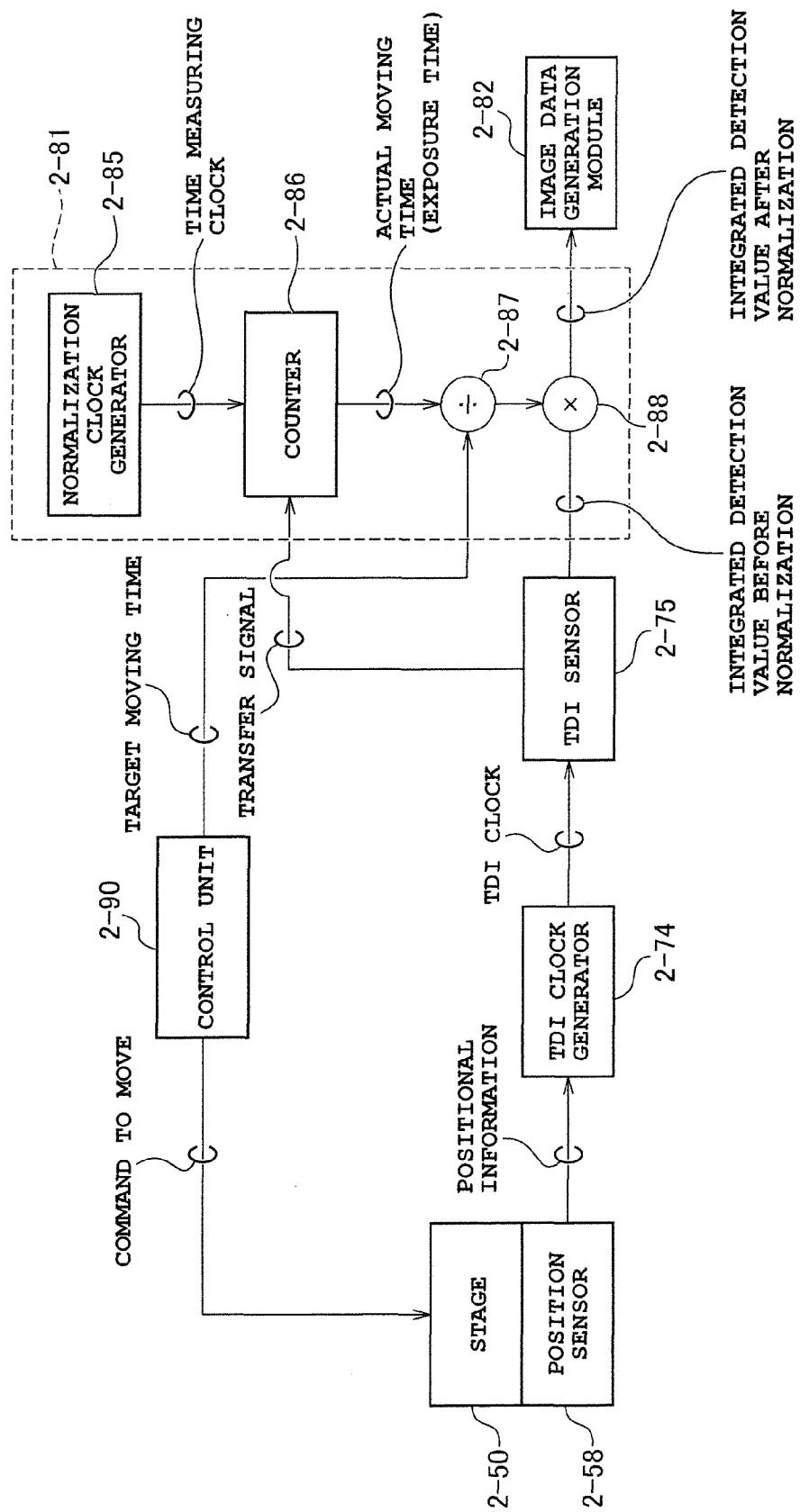
FIG. 12 is a block diagram showing an example of a configuration for normalizing an integrated detection amount.

FIG. 12 shows an example of a configuration for realizing the normalization process described above. The example shown is a configuration in which image data is generated after normalization. As shown in FIG. 12, the normalization module 2-81 includes a normalization clock generator 2-85, a counter module 2-86, a dividing module 2-87, and a multiplying module 2-88. When the control unit 2-90 issues a moving command to the stage unit 2-50 (the servo motor 2-57), the X table 2-53 is moved in the first direction D1. The moving amount of the X table 2-53 is detected by the position sensor 2-58. Then, the positional information detected by the position sensor 2-58 is inputted into a TDI clock generator 2-74. The TDI clock generator 2-74 inputs a TDI clock (a transfer clock) into the TDI sensor 2-75 based on the positional information received thereby every time the X table 2-53 moves one pixel in the first direction D1. The TDI sensor 2-57 integrates electric charges in accordance with the TDI clocks and transfers the electric charges which are accumulated to the final stage to the A/D conversion module (not shown) incorporated therein. The integrated detection values IV0 before normalization which are converted to digital values by the A/D conversion module are inputted into the multiplying module 2-88. Additionally, the TDI sensor 2-75 inputs a transfer signal which signals that the transfer has been executed into the counter module 2-86 every time the amount of secondary charged particles (the electric charge) is transferred.

On the other hand, in the normalization module 2-81, the counter module 2-86 measures an actual moving time Tn by the use of a time measuring clock which is generated by the normalization clock generator 2-85. Specifically speaking, the counter module 2-86 measures a time required to receive the transfer signals a predetermined number of times (five times in the example shown in FIG. 10) most recently by the use of the time measuring clock and inputs the measured time into the dividing module 2-87 as an actual moving time Tn. The dividing module 2-87 calculates a normalization coefficient K by the use of the expression (2) above based on a target moving time T0 inputted from the control unit 2-90 and the actual moving time Tn inputted from the counter module 2-86. The normalization coefficient K so calculated is inputted into the multiplying module 2-88, whereby a normalization process, that is, an operation based on the expression (1) above is executed in the multiplying module 2-88. The results of the operation in the multiplying module 2-88, that is, the integrated detection amount IV1 after normalization is inputted into the image data generation module 2-82.

Although not shown, when the image data generating module 2-82 composites the data transferred from the TDI sensor 2-75 to generate image data, whereafter the normalization module 2-81 normalizes the generated image data, the normalization module 2-81 can normalize the image data as follows, for example. Firstly, similar to what is shown in FIG. 12, the normalization module 2-81 measures actual moving times Tn sequentially or calculates normalization coefficients K sequentially and stores the actual moving times Tn or the normalization coefficients K so calculated in a buffer. Next, the normalization module 2-81 extracts sequentially the data groups that the normalization module 2-81 receives from the TDI sensor 2-75 in a single transfer from the image data generated by the image data generation module 2-82 in the order in which the normalization module 2-81 receives the data groups from the TDI sensor 2-75. Then, the normalization module 2-81 normalizes the data groups so extracted.

According to the inspection system 2-5 that has been described heretofore, the integrated detection values IV0 before normalization which are integrated by the TDI sensor 2-75 are normalized based on the actual exposure times (the actual moving times Tn) of the wafer W. Consequently, even though the moving times of the wafer W, that is, the exposure times thereof vary, it is possible to generate the image data in which the unevenness in luminance attributed to the variation in exposure time is mitigated. As a result of this, the accuracy of the inspection which utilizes the image data can be improved. Moreover, in the inspection system 2-5, the normalization is executed by using, as the actual moving time Tn, the time which is actually required for the wafer W to move the distance corresponding to the pixels of the TDI sensor 2-75 which are arranged in the predetermined number of stages in the first direction D1, that is, the normalization is executed by using the whole of the time required to integrate the integrated detection amounts IV0 before normalization which are transferred by the TDI sensor 2-75. Therefore, when compared with the normalization which uses part of the whole of the integration time, the accuracy of normalization is enhanced, thereby making it possible to generate the image data in which the unevenness in luminance is largely mitigated. Additionally, according to the inspection system 2-5, the integrated detection values IV0 before normalization are normalized after they have been converted to the digital values, and therefore, the normalization operation can easily be executed.

2-B. Modified Embodiment 2-B

2-B-1. Modified Embodiment 2-B-1

In the normalization described above, the actual moving time Tn which is used in the expression (2) above may be a time required for the wafer W to move only part of the distance which corresponds to the pixels of the TDI sensor 2-75 which are arranged in the predetermined number of states in the first direction D1. In this case, the target moving time T0 may be set as a time which corresponds to the part of the distance. For example, when the number of stages in which the pixels of the TDI sensor are arranged is 2048, the actual moving time Tn may be a time required for the wafer W to move a distance corresponding to 2047 pixels. According to this configuration, the generation speed of image data can be enhanced without influencing largely the accuracy of normalization.

2-B-2. Modified Embodiment 2-B-2

The normalization described above may include an operation other than the operation described above. For example, in addition to the operations in the expressions (1), (2) above, a predetermined offset amount may be subtracted from the integrated detection amount IV0 before normalization or the integrated detection amount IV1 after normalization. The subtraction above is executed to remove dark current noise. An integrated detection value that is obtained by executing an imaging in advance by the TDI sensor 2-75 in such a state that no beam is irradiated onto the wafer W may be used for the offset amount. The offset amount may be set when the inspection system 2-5 is activated or may be set every time a predetermined number of wafers W are inspected. According to this configuration, it is possible to generate the image data in which the influence of dark current noise is reduced. As a result of this, the accuracy of the inspection which utilizes the image data can be improved.

Alternatively, in the normalization, in addition to the operations in the expressions (1), (2) above, the increase or decrease ratio which is determined in advance for each imaging element group which is made up of the imaging elements arranged in the first direction D1 may be multiplied by the integrated detection amount. This multiplication is executed to correct the variation in received light sensitivity for each imaging element group. The increase or decrease ratio to be multiplied may be set so that the variation of integrated detection values in the second direction D2 is mitigated which are obtained by irradiating light from the same light source onto the individual pixels of the TDI sensor 2-75 for imaging in advance. In addition, in the normalization, a coefficient obtained by multiplying the increase or decrease ratio by the normalization coefficient K may be used in place of using the normalization coefficient K. According to this configuration, since the variation in received light sensitivity for each imaging element group is corrected, the accuracy of the inspection which utilizes the image data can be improved.

2-B-3. Modified Embodiment 2-B-3

In the normalization, in place of the integrated detection amounts which are expressed by digital values, the integrated detection amounts which are expressed by analog values may be normalized. A real time analog calculation unit may be used for normalization of the analog values. In this case, the integrated detection values are A/D converted after normalization. According to this configuration, since the normalization is executed in such a state that no quantization error is contained, the accuracy of the image data can be enhanced.

2-B-4. Modified Embodiment 2-B-4

The integrating direction of the TDI sensor 2-75 is not limited to the first direction D1 and hence may be the second direction D2. In this case, a charged particle or an electromagnetic wave may be irradiated onto the wafer W while moving the wafer W in the second direction D2. Additionally, the position sensor 2-58 may be provided in any positions where the position sensor 2-58 can detect the position of the wafer W in the second direction D2.

2-B-5. Modified Embodiment 2-B-5

In the embodiment described above, although the normalization module 2-81 is described as being part of the image processing unit 2-80, the normalization module 2-81 may be provided in an arbitrary position in the whole of the inspection system 2-5. For example, the normalization module 2-81 may be configured as a medium processing module which is provided between the TDI sensor 2-75 and the image processing unit 2-80. Alternatively, the normalization module 2-81 may be configured as a signal processing module (for example, FPGA (Field Programmable Gate Array)) which is included in the TDI sensor 2-75.

3. Third Embodiment Group

A first embodiment of a third embodiment group of the invention is provided as an inspection display unit. The inspection display unit includes a differential data calculation module configured to compare an inspection image data generated based on the results of a detection of an amount of secondary charged particles obtained by irradiating either of a charged particle and an electromagnetic wave as a beam onto an inspection target with reference image data prepared in advance to calculate differential data which reflects a difference between gradation values of corresponding individual pixels that make up the inspection image data and gradation values of individual pixels that make up the reference image data, and a display module configured to display at least one of a numeric matrix configured to reflect the individual values of the differential data and a differential image configured to reflect the individual values of the differential data so that whether the difference on which the calculation of the differential data is based is plus or minus can be identified.

According to the inspection display unit configured in the way described above, at least one of the numeric matrix and the differential image is displayed so that whether the difference between the gradation values of the individual pixels of the inspection image data and the gradation values of the corresponding individual pixels of the reference image data is plus or minus can be identified. Since the difference is such that plus or minus thereof is reversed depending upon whether the defect is a white defect or a black defect, according to this inspection display unit, the operator can easily discriminate between the white defect and the black defect. As a result, labor for the determination can be saved. In the case of the numeric matrix being displayed, the operator can determine on the defect accurately and quantitatively. In the case of the differential image being displayed, the operator can determine on the defect easily and visually.

According to a second embodiment of the third embodiment group, in the first embodiment, the differential data calculation module calculates the differential data by offsetting the difference so that the value of the differential data becomes zero or larger at all times. According to this embodiment, the differential data can be used as gradation values by which the white defect and the black defect can be discriminated from each other. Consequently, it is possible to execute various displays which can discriminate between the white defect and the black defect based on the differential data.

According to a third embodiment of the third embodiment group, in the second embodiment, the display module displays, as the differential image, an image having the individual values of the differential data as gradation values or an image which is color converted based on the gradation values. According to this embodiment, the operator can discriminate between the white defect and the black defect easily and visually by observing the differential image.

According to a fourth embodiment of the third embodiment group, in the first embodiment, the differential data calculation module calculates a difference in which plus and minus are discriminated as the differential data. According to this embodiment, since the difference between the white defect and the black defect appears as the difference in plus and minus of the differential data, it is possible to execute various displays which can discriminate between the white defect and the black defect based on the differential data.

According to a fifth embodiment of the third embodiment group, in the fourth embodiment, the display module displays an image which is displayed in different hues depending on whether each of the values of the differential data is plus or minus. According to this embodiment, the operator can discriminate between the while defect and the black defect easily and visually by observing the differential image.

According to a sixth embodiment of the third embodiment group, in any one of the first to fifth embodiments, the display module displays the individual values of the differential data or values which are obtained by applying a given operation to the individual values of the differential data as the numeric matrix. According to this embodiment, the operator can determine on the defect accurately and quickly.

A seventh embodiment of the third embodiment group is provided as a classification method for classifying a defect that an inspection target possesses. In this method, inspection image data generated based on the results of a detection of an amount of secondary charged particles obtained by irradiating either of a charged particle and an electromagnetic wave as a beam onto an inspection target is compared with reference image data which is prepared in advance to calculate differential data which reflects a difference between gradation values of individual pixels that make up the inspection image data and gradation values of corresponding individual pixels that make up the reference image data. Then, at least one of a numeric matrix configured to reflect the individual values of the differential data and a differential image configured to reflect the individual values of the differential data is displayed so that whether the difference on which the calculation of the differential data is based is plus or minus can be identified. Then, the type of a defect is determined based on the results of the display. According to this method, the same advantage as that provided by the first embodiment is provided.

An eighth embodiment of the third embodiment group is provided as a storage medium on which an inspection display program is recorded. The program recorded on this storage medium enables a computer to realize a differential data calculation function in which an inspection image data generated based on the results of a detection of an amount of secondary charged particles obtained by irradiating either of a charged particle and an electromagnetic wave as a beam onto an inspection target is compared with reference image data prepared in advance to calculate differential data which reflects a difference between gradation values of individual pixels that make up the inspection image data and gradation values of corresponding individual pixels that make up the reference image data, and a display function in which at least one of a numeric matrix configured to reflect the individual values of the differential data and a differential image configured to reflect the individual values of the differential data is displayed so that whether the difference on which the calculation of the differential data is based is plus or minus can be identified. According to this storage medium, the same advantage as that provided by the first embodiment is provided.

In addition to the aspects that have been described as being realized above, the embodiments of the invention can be realized in various aspects including a inspection system, an inspection method, a storage medium on which a computer-readable program is recorded, and the like. Hereinafter, the third embodiment group will be described by reference to a more specific embodiment.

3-A. Embodiment 3-A

Figure 13:
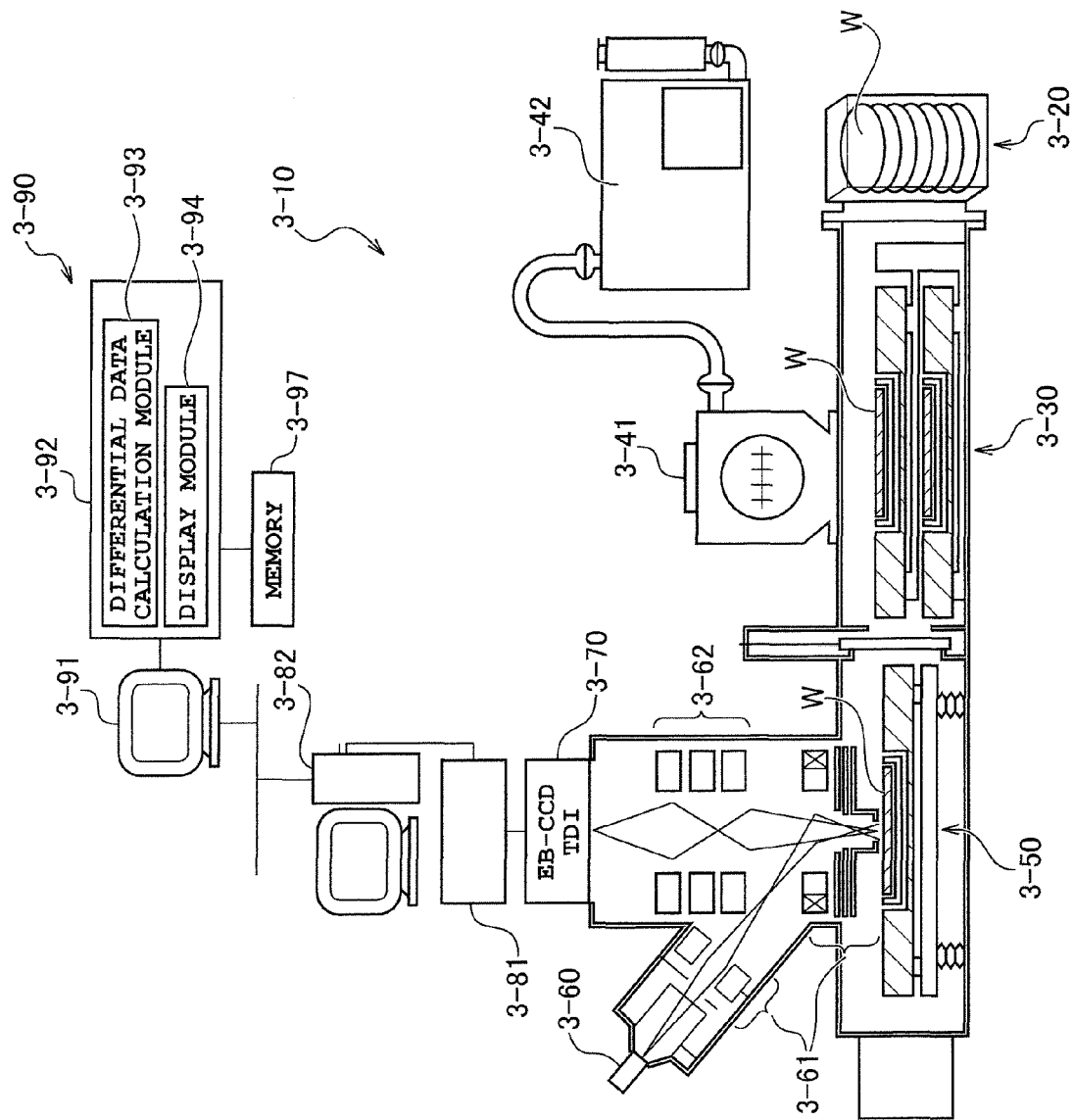
FIG. 13 is an explanatory drawing showing a schematic configuration of an inspection system which utilizes an inspection display apparatus as a further embodiment of the invention.

FIG. 13 is a schematic drawing which shows an example of a inspection system 3-10 which utilizes an inspection display unit 3-90 as an embodiment of the invention. The inspection system 3-10 is a system which inspects a pattern formed on a surface of an inspection target for a defect, inspects the surface of the inspection target for a foreign matter existing thereon, and the like. The inspection system 3-10 includes a cassette holder 3-20, a preliminary environment chamber 3-30, a turbo-molecular pump 3-41, a dry pump 3-42, a stage unit 3-50, a light source 3-60, a primary optical system 3-61, a secondary optical system 3-62, a detection unit 3-70, a storage unit 3-81, an image data generation unit 3-82, and an inspection display unit 3-90.

The cassette holder 3-20 is configured to hold a plurality of cassettes. A plurality of wafers W as inspection targets are accommodated in the cassette in such a way that the wafers W are aligned parallel in a vertical direction. The atmosphere in the preliminary environment chamber 3-30 is controlled so as to create a high vacuum state (at the degree of vacuum of $10^{-5}$ to $10^{-6}$ Pa) therein by the turbo-molecular pump 3-41 and the dry pump 3-42 and an inert gas is injected thereinto. The stage unit 3-50 has a mechanism for holding a wafer W which is conveyed thereto from the cassette holder 3-20 through the preliminary environment chamber 3-30, and moves the wafer W held by the holding mechanism in an X direction, a Y direction and a θ direction.

The light source 3-60 generates either of a charged particle and an electromagnetic wave as a beam. The beam generated by the light source 3-60 is irradiated through the primary optical system 3-61 onto the wafer W which is moved by the stage unit 3-50. The primary optical system 3-61 includes a lens group which controls the shape of the beam, and an aligner group which controls the traveling direction of the beam. A secondary charged particle which matches a state of a surface of the wafer W (a state in which a pattern is formed on the surface, a state in which a foreign matter sticks to the surface of the wafer W, and the like) is obtained by irradiating the bean onto the wafer W.

The secondary charged particle so obtained is detected by the detection unit 3-70 via the secondary optical system 3-62. The secondary optical system 3-62 includes an objective lens group, a relay lens group, a magnifying lens group, a projection lens group, and an aligner group.

The detection unit 3-70 includes imaging devices such as an EB-CCD (electron bombarded charge coupled device), an EB-TDI (electron bombarded Time Delay Integration) sensor and the like. Imaging data which is imaged by the detection unit 3-70 is stored in the storage unit 3-81. The image data generation unit 3-82 generates inspection image data based on the imaging data stored in the storage unit 3-81 and stores it in a memory of the image data generation unit 3-82. The inspection image data has luminance values which reflect a state of the surface of the wafer W and is provided for inspecting the state of the surface of the wafer W. Additionally, reference image data is stored in advance in the memory of the image data generation unit 3-82. The reference image data is image data which is supposed to be obtained by the detection unit 3-70 when there is caused no defect in the inspection target. An image formed based on the inspection image data is also referred to as an inspection image, and an image formed based on the reference image data is also referred to as a reference image. A personal computer having a predetermined program installed therein can be used as the image data generation unit 3-82.

The inspection display unit 3-90 includes a display 3-91, a CPU 3-92, and a memory 3-97 and is connected to the image data generation unit 3-82 via a network. The CPU 3-92 realizes various functions by executing the program stored in the memory 3-97. In this embodiment, functions realized by the CPU 3-92 are preparation and display of a defect map, preparation and display of a defect list, display of inspection information, display of inspection image and reference image, preparation and display of differential image, preparation and display of numeric matrix, and preparation and display of sectional gradation value graph. The preparation and display of these types of information are operated by the use of a GUI (Graphical User Interface) which is displayed on the display 3-91.

The defect map is an image which shows a distribution of defect areas in the inspection image. The CPU 3-92 acquires the inspection image and the reference image from the image data generation unit 3-82 and determines as a defect an area where an absolute difference between an inspection image gradation value Gc which is a gradation value of the inspection image and a reference image gradation value Gr which is a gradation value of the reference image is equal to or larger than a threshold Th1, preparing a defect map. The inspection image which is determined as having a defect is also referred to as a defect image. The defect list is tabular positional information regarding the detected defect area. This positional information is prepared together with the defect map. In this embodiment, the defect map or the defect list is displayed on the GUI, and the operator selects a desired defect, whereby a differential image, a numeric matrix, a sectional gradation value graph and the like which correspond to the selected defect are displayed on the display 3-91. These may be displayed in specific windows respectively at the same time or may be displayed selectively. The inspection information is information regarding inspection date and hours, inspecting conditions, and details of inspection targets. The inspection information is associated with the inspection image and stored in the memory of the image data generation unit 3-82, and the CPU 3-92 acquires the inspection information from the image data generation unit 3-82 to display it.

The preparation of a differential image is realized as a function of the differential data calculation module 3-93. The differential image is an image which is formed so as to reflect individual values of differential data Dd. The differential data Dd is data which reflects a difference D (Gc−Gr) between gradation values of individual pixels of the inspection image data (inspection image gradation values Gc) and gradation values of individual pixels of the reference image data (reference image gradation values Gr) which is obtained by comparing the inspection image data and the reference image data. When the difference D takes a plus value, this means that the pixel has a pixel value which is brighter than estimated, resulting in a possibility that the defect is a white defect. When the difference D takes a minus value, this means that the pixel has a pixel which is darker than estimated, resulting in a possibility that the defect is a black defect. It is noted that the difference D may be Gr−Gc, and in this case, the correspondence relationship between the plus or minus of the difference D and the while defect or the black defect is reversed.

In this embodiment, the differential data calculation module 3-93 calculates the differential data Dd by offsetting the difference D. The offsetting of the difference D is executed so that the value of the differential data Dd becomes a value which is zero or larger at all times. For example, when the gradation values (luminance values) of the inspection image data and the reference image data are 256 gradations of 0 to 255, the differential data calculation module 3-93 can calculate the differential data by the following expression (1). In this case, the differential data Dd can take any of gradation values 1 to 511 depending on the values of the inspection image gradation value Gc and the reference image gradation value Gr.

$$Dd=(Gc-Gr)+256 \qquad (1)$$

The differential data Dd can be used as a gradation value with which white defect and the black defect can be discriminated. When the inspection image has a white defect, since the inspection image looks brighter than the reference image in the defect area, a relationship of "inspection image gradation value Gc>reference image gradation value Gr" is established. On the other hand, when the inspection image has a black defect, since the inspection image look darker than the reference image in the defect area, a relationship of "inspection image gradation value Gc<reference image gradation value Gr" is established. Here, when an area where an absolute difference between the inspection image gradation value Gc and the reference image gradation value Or is equal to or larger than a threshold TH1 is determined as a defect, the gradation value of the pixel which has the white defect satisfies the following expression (2), and the pixel which has the black defect is a pixel which satisfies the following expression (3). As is obvious from the description made above, the differential data Dd is such that the plus or minus of the difference D on which the calculation of the differential data Dd is based can be identified.

$$Dd>256+TH1 \qquad (2)$$

$$Dd<256-TH1 \qquad (3)$$

The display of the differential image is realized as a function of the display module 3-94. The display module 3-94 displays the differential image based on the differential data Dd which is calculated by the differential data calculation module 3-93. In this embodiment, the display module 3-94 uses the differential data Dd as it is as the gradation value of the differential image to thereby display the differential image. However, the differential data Dd may be gradation converted into a predetermined number of gradations, for example, 256 gradations to thereby be displayed as the differential image. The operator can discriminate between the white defect and the black defect easily and visually based on the aforesaid difference in gradation value between the white defect and the black defect by observing the differential image displayed by the display 3-91. In the differential image, a non-defect portion is observed as gray (whose gradation value is, for example, of the order of 256 in 512 gradations), while only the white defect and the black defect are observed conspicuously as being bright or dark. Thus, when the differential image is displayed, the operator can discriminate between the white defect and the black defect more easily than when the defect image is displayed.

The preparation and display of the numeric matrix is realized as function of the display module 3-94. The numeric matrix is groups of numbers which are arranged into a matrix in such a way as to correspond to pixels of an image with respect to position. The numeric matrix includes a group of numbers which reflect the individual values of the differential data Dd. In this embodiment, the group of numbers which reflect the individual values of the differential data Dd are the individual values of the differential data Dd. However, the group of numbers which reflect the individual values of the differential data Dd may be values which results from application of a given operation to the individual values of the differential data Dd. The operator can determine quantitatively which of the expressions (2) and (3) described above the gradation values of the defect portion satisfy by confirming the numeric matrix displayed on the display 3-91. Because of this, an accurate and quick defect determination can be made. The given operation described above can be addition, subtraction, multiplication, division, or a combination thereof. As is obvious from this, the values of the numeric matrix may be negative numbers or numbers other than integers. For example, in case the numeric matrix is made up of values resulting when the individual values of the differential data Dd are divided by 256, the value of the pixel having a white defect becomes larger than 1, while the value of the pixel having a black defect becomes smaller than 1. Thus, the difference between the white defect and the black defect can be grasped at a glance. The numeric matrix may include a group of numbers which are made up of gradation values of the defect image. In this case, the CPU 3-92 may be configured to receive a command from the operator which designates the numeric matrix to be displayed.

The sectional gradation value graph is a graph which shows the gradation values of the defect image. The sectional gradation value graph can be, for example, a 3D graph. The operator can grasp the distribution of defects three-dimensionally by confirming the sectional gradation value graph.

Figure 14A:
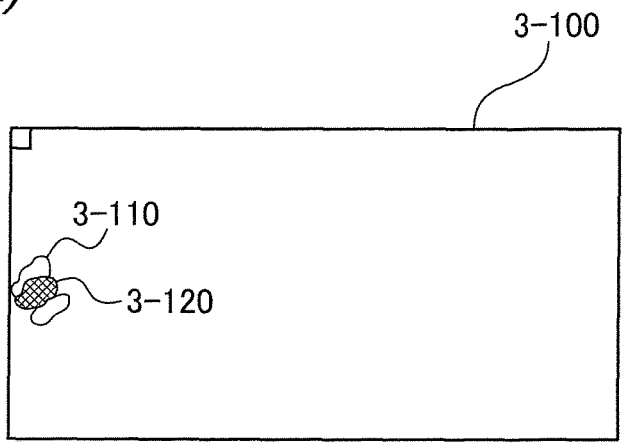
FIGS. 14(A) and 14(B) are explanatory diagrams showing schematically an inspection image and a reference image, respectively.
Figure 14B:
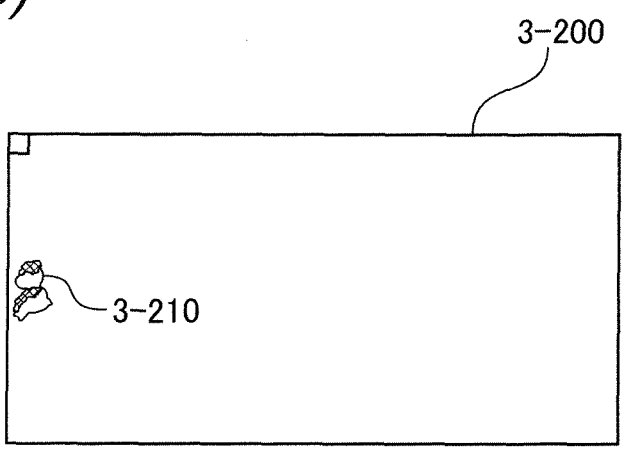

FIGS. 14(A), 14(B) show schematically an inspection image (a defect image) 3-100 and a reference image 3-200 which are displayed on the display 3-91. As shown in FIG. 14A, the defect image 3-100 includes a white defect 3-110 and a black defect 3-120 which lie close to each other. The white defect 3-110 and the black defect 3-120 show defect areas which are visually grasped by the operator. The positions of the white and black defects do not completely coincide with the actual positions of the defect areas. As shown in FIG. 14(B), the reference image 3-200 includes a planned pattern 3-210 which is a pattern formed on a surface of an inspection target. The white defect 3-110 and the black defect 3-120, and the pattern 3-210 are situated in areas which are superposed one on the other. In this way, in case the reference image 3-200 includes the pattern 3-210, when observing unevenness in luminance in the defect image 3-100, it is difficult for the operator to accurately recognize whether the unevenness in luminance is attributed to the defects or is attributed to the pattern 3-210.

Figure 15A:
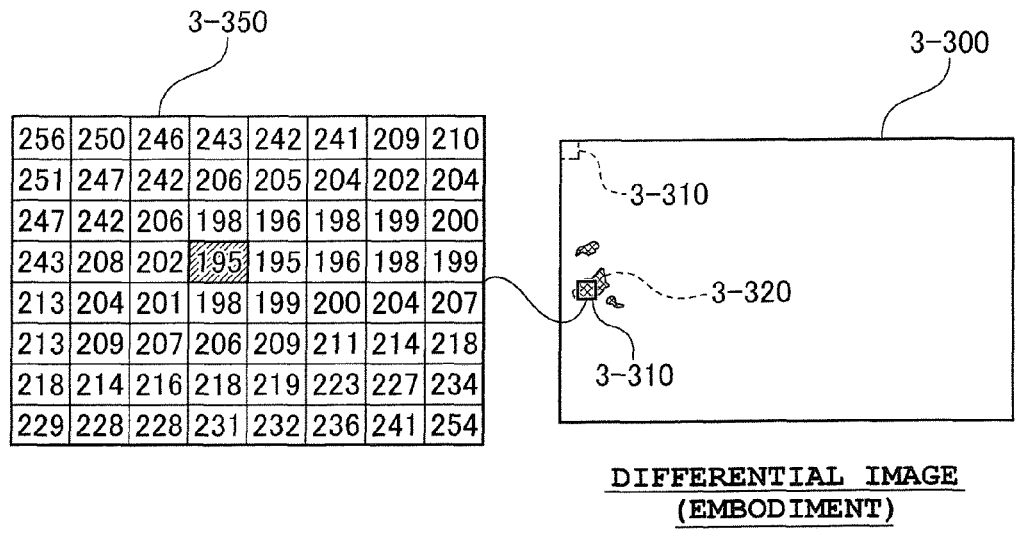
FIGS. 15(A) and 15(B) are explanatory drawings showing differential images and numeric matrixes of the embodiment and a comparison example.
Figure 15B:
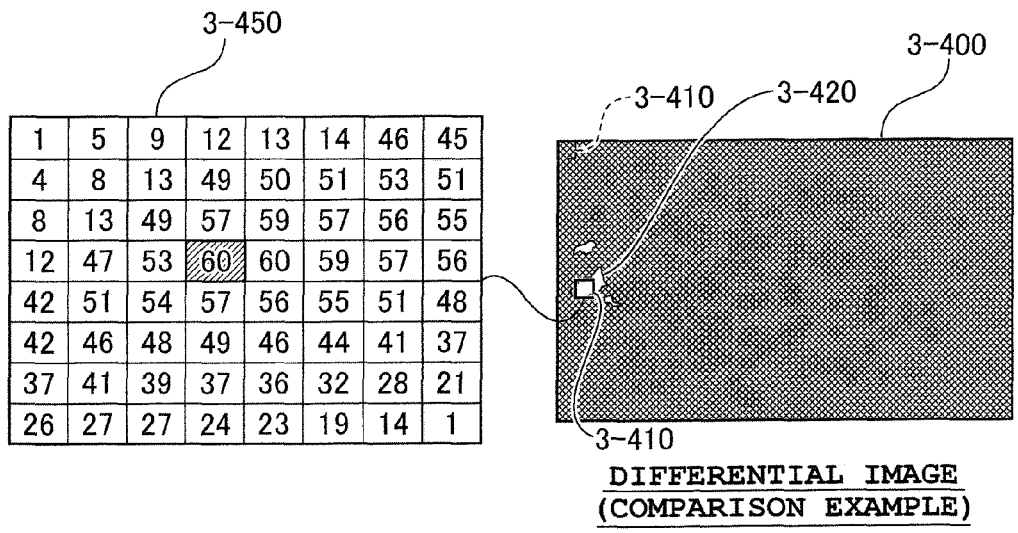

FIGS. 15(A), 15(B) show states in which a differential image and a numeric matrix which represent the embodiment (refer to FIG. 15(A)) and a differential image and a numeric matrix which represent a comparison example (refer to FIG. 15(B)) are displayed on the display 3-91. A differential image 3-300 representing this embodiment and a differential image 3-400 representing the comparison example are both obtained based on a difference D between gradation values of individual pixels of the defect image 3-100 and gradation values of corresponding individual pixels of the reference image 3-200. The differential image 3-300 is an image which has the differential data Dd as gradation values. The differential image 3-400 is an image which has the absolute values of the difference D as gradation values. In the differential image 3-300 and the differential image 3-400, accurate positions of the defects are grasped, for example, as defect areas 3-320, 3-420, respectively.

In the illustrated example, on a GUI of the inspection display unit 3-90, small windows 3-310, 3-410 which are areas made up of predetermined pixel numbers are configured to move on arbitrary positions on the differential image 3-300 and the differential image 3-400. Then, respective gradation values of pixels which belong to areas designated by the small windows 3-310, 3-410 are displayed near the differential images 3-300, 3-400 as matrixes 3-350, 3-450. As to the differential image 3-300, the operator can visually determine that a defect area 3-320 displayed darker than other areas is a black defect. Additionally, as shown in the drawing, when moving the small window 3-310 to the position of the defect area 3-320, it can also be determined quantitatively by the matrix 3-350 that the defect area 3-320 is a black defect which satisfies the expression (3) described above. For example, as shown in the drawing, it is possible to determine that the defect area is a black defect by confirming that the value of the differential data Dd is 195. It is noted that although roughly illustrated in the FIG. 15(A), the area shown white in the differential image 3-300 is gray in reality, while a hatched area is shown in a color close to black or white in reality. In addition, in place of the configuration utilizing the small window 3-310, a display may be adopted in which gradation values of all the areas of the differential image 3-300 can be scrolled through. Additionally, the display module 3-94 does not necessarily have to display both the differential image 3-300 and the matrix 3-350, and hence, a configuration may be adopted in which the display module 3-94 is configured to display either of the differential image 3-300 and the matrix 3-350.

On the other hand, as to the differential image 3-400, although the operator can confirm visually the position of the defect area 3-420 shown white, since the difference D is processed to be an absolute value, the operator cannot determine on the defect area 3-420. This remains true even though the matrix 3-450 is used. In this case, the operator has to spare many labor hours, for example, in confirming the gradation values of the pixels of the defect image 3-100 and the gradation values of the corresponding pixels of the reference image 3-200 to determine on the type of the defect. In this way, according to the inspection display unit 3-90 of this embodiment, compared with the conventional counterpart, many labor hours can be saved in discriminating between the white defect and the black defect.

The type of the defect that is determined in the way described above is inputted into the inspection display unit 3-90 by the use of the GUI to be stored in the memory 3-97.

The display module 3-94 of the inspection display unit 3-90 may be configured to execute various additional processing operations to enhance visibility of the differential image 3-300. For example, the differential image 3-300 may be color converted to a color image. The display module 3-94 may be configured, for example, to convert the gradation value (gray scale) of only one of the white defect and the black defect to a gradation value of a predetermined hue (for example, a gradation value of R in RGB gradations) so as to display the defect in color or to convert the gradation values of both the white defect and the black defect to gradation values of different hues (for example, one is converted to the R gradation and the other is to the G gradation) so as to display the defects in color. The color conversion is not limited to the linear conversion, and hence, the display module 3-94 may execute a color conversion only on the pixel of the defect area, that is, the pixel which satisfies the expression (2) or (3) above so as to display the pixel in a highlighted fashion. Known various methods can be used as the highlighting display method. For example, the display module 3-94 may increase or decrease the gradation value of the pixel in question in a direction in which the contrast is increased or may cause the pixel in question to blink in such a way as to be associated with the type of the defect. In these cases, in the matrix 3-350, in case the values of the differential data Dd are allowed to be displayed as they are, there is caused no such situation that the quantitative determination of the defect is affected.

Additionally, the display module 3-94 may be configured to execute additional various processing operations to enhance the visibility of the matrix 3-350. For example, the display module 3-94 may be configured to display only the value of the defect area in a highlighted fashion. In place of or in addition to this configuration, the display module 3-94 may be configured to display in an highlighted fashion the gradation value of a pixel in the black defect area whose differential data Dd is the smallest or to display in an highlighted fashion the gradation value of a pixel of the white defect area whose differential data Dd is the largest. When both the value of the defect area and the largest value or the smallest value are displayed in an highlighted fashion, different highlighting display methods may be applied to each of the values.

3-B. Modified Embodiment 3-B

3-B-1. Modified Embodiment 3-B-1

The differential data calculation module 3-93 may not necessarily calculate the differential data Dd by offsetting the difference D. For example, the differential data calculation module 3-93 may calculate the value of the difference D (the value whose plus or minus is discriminated) as the differential data Dd. In this configuration, too, the difference between the while defect and the black defect appears as the difference in plus and minus of the differential data Dd, and therefore, it is possible to execute various displays which can identify the difference between the white defect and the black defect, based on the differential data Dd. For example, the display module 3-94 may display an image which is displayed in different hues depending on the difference in plus and minus of the value of the differential data Dd as the differential image. In this case, an absolute value of the differential data Dd may be used as a gradation value of a predetermined hue. Alternatively, the gradation in question may be color converted to calculate a gradation value of the image.

3-B-2. Modified Embodiment 3-B-2

The image data generation unit 3-82 may include at least part of the functions of the inspection display unit 3-90, in particular, the functions of the differential data calculation module 3-93 and the display module 3-94. For example, when the functions of the inspection display unit 3-90 described above are divided to the image data generation unit 3-82 and the inspection display unit 3-90, both the image data generation unit 3-82 and the inspection display unit 3-90 can be taken as the inspection display unit. When the image data generation unit 3-82 includes the whole of the functions of the inspection display unit 3-90 described above, the image data generation unit 3-82 can be taken as the inspection display unit. In this case, the inspection display unit 3-90 may function as a thin client by utilizing a viewer installed therein, or the inspection display unit 3-90 may be omitted.

3-B-3. Modified Embodiment 3-B-3

The form of display of the display module 3-94 is not limited to the display on the display 3-91, and hence, the display module 3-94 can take an arbitrary form of display. For example, the form of display may be a projection to a screen or printing.

Thus, while the embodiments of the invention have been described by reference to some specific embodiments, the embodiments of the invention that have been described heretofore are made to facilitate the understanding of the invention, and there is no intention to limit the invention by those embodiments. The invention can be modified or improved variously without departing from the sprit thereof, and the resulting equivalents are, of course, incorporated in the invention. In addition, it is possible to combine or omit arbitrarily the constituent elements that are described in claims and the specification within the scope where at least part of the problems described above can be solved or at least part of the advantages can be provided.

What is claimed is:

1. An inspection system comprising:
   a primary optical system configured to irradiate either of a charged particle and an electromagnetic wave as a beam;
   a movable unit configured to hold an inspection target and move the inspection target through a position where the beam is irradiated by the primary optical system in a predetermined direction;
   a TDI sensor configured to integrate an amount of secondary charged particles in a predetermined direction through a time delay integration to sequentially transfer the integrated amount of secondary charged particles as an integrated detection amount, the secondary charged particles being obtained by irradiating the beam onto the inspection target while moving the movable unit in the predetermined direction; and
   a prevention module configured to prevent an arrival of the beam at the inspection target side or an arrival of the secondary charged particles at the TDI sensor during a time period from one transfer to the following transfer after the elapse of a predetermined length of time from the one transfer and until the following transfer.

2. The display system according to claim 1, wherein
   the primary optical system integrates charged particles as the beam, and wherein
   the prevention module deflects the beam to execute blanking and prevents the arrival of the beam at the inspection target side.

3. The inspection system according to claim 1, wherein
   the primary optical system integrates electromagnetic waves as the beam, and wherein
   the prevention module cuts off the beam traveling from the primary optical system towards the inspection target side by an openable and closable shutter configured to cut off the electromagnetic waves to prevent the arrival of the beam at the inspection target side.

4. An inspection image data generation method comprising:
   irradiating either of a charged particle and an electromagnetic wave as a beam onto an inspection target while moving the inspection target in a predetermined direction;
   integrating an amount of secondary charged particles in a predetermined direction through a time delay integration by using a TDI sensor to sequentially transfer the integrated amount of secondary charged particles as an integrated detection amount, secondary charged particles being obtained by irradiating the beam onto the inspection target;

preventing an arrival of the beam at the inspection target or an arrival of the secondary charged particles at the TDI sensor during a time period from one transfer to the following transfer after the elapse of a predetermined length of time from the one transfer and until the following transfer; and generating image data based on the integrated detection amount.

5. An inspection system comprising:

a primary optical system configured to irradiate either of a charged particle and an electromagnetic wave as a beam;

a movable unit configured to hold an inspection target and move the inspection target in a predetermined direction through a position where a beam is irradiated by the primary optical system;

a TDI sensor which has a plurality of imaging elements which are arranged in a predetermined number of stages in a predetermined direction, the TDI sensor integrating an amount of secondary charged particles in a predetermined direction through a time delay integration to sequentially transfer the integrated amount of secondary charged particles as an integrated detection amount, the secondary charged particles being obtained by irradiating the beam onto the inspection target while moving the movable unit in the predetermined direction;

an image generation module configured to generate image data based on the integrated detection amount; and a normalization module configured to normalize the integrated detection amount or the image data based on a time required for the movable unit to move a predetermined distance during the integration.

6. The inspection system according to claim 5, wherein the normalization module is configured to subtract an offset amount which is determined in advance from the integrated detection amount or a gradation value of the image data before or after the normalization, in addition to the normalization.

7. The inspection system according to claim 5, wherein the TDI sensor comprises a plurality of imaging element groups, each of which includes a plurality of imaging elements which are arranged in a predetermined number of stages in a predetermined direction, the imaging element groups being arranged in a plurality of stages in a direction perpendicular to the predetermined direction, and wherein the normalization module is configured to multiply the integrated detection amount or a graduation value of the image data before or after the normalization by an increase or decrease ratio which is determined for each of the imaging element groups, in addition to the normalization.

8. The inspection system according to claim 5, wherein the normalization module normalizes the integrated detection value which is expressed by a digital value.

9. The inspection system according to claim 5, wherein the normalization module normalizes the integrated detection value which is expressed by an analog value.

10. The inspection system according to claim 5, wherein the predetermined distance is a distance which corresponds to the plurality of imaging elements which are arranged in the predetermined number of stages.

11. An inspection display unit comprising:

a differential data calculation module configured to compare inspection image data generated based on the results of a detection of an amount of secondary charged particles obtained by irradiating either of a charged particle and an electromagnetic wave as a beam onto an inspection target with reference image data prepared in advance to calculate differential data which reflects a difference between gradation values of corresponding individual pixels that make up the inspection image data and gradation values of individual pixels that make up the reference image data; and a display module configured to display at least one of a numeric matrix configured to reflect the individual values of the differential data and a differential image configured to reflect the individual values of the differential data so that a sign of the difference on which the calculation of the differential data is based can be identified.

12. The inspection display unit according to claim 11, wherein the differential data calculation module calculates the differential data by offsetting the difference so that the value of the differential data becomes zero or larger at all times.

13. The inspection display unit according to claim 12, wherein the display module displays, as the differential image, an image having the individual values of the differential data as gradation values or an image which is color converted based on the gradation values.

14. The inspection display unit according to claim 11, wherein the differential data calculation module calculates a difference in the sign of the difference is discriminated as the differential data.

15. The inspection display unit according to claim 14, wherein the display module displays an image which is displayed in different hues depending on signs of the values of the differential data.

16. The inspection display unit according to claim 11, wherein the display module displays the individual values of the differential data or values which are obtained by applying a given operation to the individual values of the differential data as the numeric matrix.

17. An inspection image data generation method comprising:

irradiating either of a charged particle and an electromagnetic wave as a beam while moving an inspection target in a predetermined direction, integrating an amount of secondary charged particles which are obtained by irradiating the beam onto the inspection target in a predetermined direction through a time delay integration to detect the resulting amount of secondary charged particles as an integrated detection amount by using a TDI sensor which has a plurality of imaging elements which are arranged in a predetermined number of stages in a predetermined direction, generating image data based on the integrated detection amount, and normalizing the integrated detection amount or the image data based on a time required for the inspection target to move a predetermined distance during the integration.

18. A classification method for classifying a defect that an inspection target possesses, the method comprising:
- comparing inspection image data generated based on the results of a detection of an amount of secondary charged particles obtained by irradiating either of a charged particle and an electromagnetic wave as a beam onto an inspection target with reference image data which is prepared in advance to calculate differential data which reflects a difference between gradation values of individual pixels that make up the inspection image data and gradation values of corresponding individual pixels that make up the reference image data,
- displaying at least one of a numeric matrix configured to reflect the individual values of the differential data and a differential image configured to reflect the individual values of the differential data so that a sign of the difference on which the calculation of the differential data is based is visible, and
- determining the type of a defect based on the results of the display.

19. A storage medium on which an inspection display program is recorded, the storage medium storing a program for causing a computer to execute a process, comprising:
- comparing an inspection image data generated based on the results of a detection of an amount of secondary charged particles obtained by irradiating either of a charged particle and an electromagnetic wave as a beam onto an inspection target with reference image data prepared in advance to calculate differential data which reflects a difference between gradation values of individual pixels that make up the inspection image data and gradation values of corresponding individual pixels that make up the reference image data, and
- displaying at least one of a numeric matrix configured to reflect the individual values of the differential data and a differential image configured to reflect the individual values of the differential data so that a sign of the difference on which the calculation of the differential data is based is visible.

* * * * *

UNITED STATES PATENT AND TRADEMARK OFFICE
CERTIFICATE OF CORRECTION

| | | |
|---|---|---|
| PATENT NO. | : 9,105,445 B2 | Page 1 of 1 |
| APPLICATION NO. | : 14/220719 | |
| DATED | : August 11, 2015 | |
| INVENTOR(S) | : Ryo Tajima | |

It is certified that error appears in the above-identified patent and that said Letters Patent is hereby corrected as shown below:

In Column 12, line 62, please delete "," and insert --.--

In Column 26, line 32, please delete "Or" and insert --Gr--

Signed and Sealed this
Twenty-third Day of February, 2016

Michelle K. Lee
*Director of the United States Patent and Trademark Office*